US006158447A

United States Patent [19]

Kamikawa et al.

[11] Patent Number: 6,158,447

[45] Date of Patent: Dec. 12, 2000

[54] CLEANING METHOD AND CLEANING EQUIPMENT

[75] Inventors: Yuji Kamikawa, Koshi-machi; Naoki Shindo, Kurume; Shigenori Kitahara, Chikugo; Miyako Yamasaka, Nagasaka-cho, all of Japan

[73] Assignee: Tokyo Electron Limited, Tokyo, Japan

[21] Appl. No.: 09/149,852

[22] Filed: Sep. 8, 1998

[30] Foreign Application Priority Data

Sep. 9, 1997 [JP] Japan .................................... 9-260823
Sep. 17, 1997 [JP] Japan .................................... 9-269215

[51] Int. Cl.[7] ........................................................ B08B 3/02

[52] U.S. Cl. .................... 134/56 R; 134/113; 134/100.1; 134/95.1; 134/902

[58] Field of Search ............................... 134/56 R, 57 R, 134/58 R, 113, 100.1, 99.1, 99.2, 95.1, 902

[56] References Cited

U.S. PATENT DOCUMENTS

| | | | |
|---|---|---|---|
| 3,652,427 | 3/1972 | Flood et al. . | |
| 3,964,956 | 6/1976 | Snyder | 134/902 |
| 5,275,184 | 1/1994 | Nishizawa et al. | 134/902 |
| 5,404,893 | 4/1995 | Brady et al. . | |
| 5,520,744 | 5/1996 | Fujikawa et al. | 134/902 |
| 5,722,441 | 3/1998 | Teramoto | 134/902 |
| 5,950,645 | 9/1999 | Olesen et al. | 134/902 |

FOREIGN PATENT DOCUMENTS

| | | | |
|---|---|---|---|
| 61-281532 | 12/1986 | Japan | 134/902 |
| 3-237717 | 10/1991 | Japan | 134/902 |
| 3-286517 | 12/1991 | Japan | 13/902 |
| 4-207031 | 7/1992 | Japan . | |
| 4-278529 | 10/1992 | Japan | 134/902 |
| 7-22369 | 1/1995 | Japan . | |
| 7-45580 | 2/1995 | Japan . | |

*Primary Examiner*—Frankie L. Stinson
*Attorney, Agent, or Firm*—Morrison & Forester

[57] ABSTRACT

A cleaning equipment generally comprises: a cleaning bath 30 for storing therein a cleaning solution to allow a semiconductor wafer W to be dipped in the cleaning solution to clean the surface of the wafer W; a cleaning solution supply pipe 33 for connecting the cleaning bath 30 to a pure water supply source 31; a chemical storing container 34 for storing therein a chemical; a chemical supply pipe 36 for connecting the cleaning solution supply pipe 33 to the chemical storing container 34 via an injection shut-off valve 35; and a diaphragm pump 37 for injecting a predetermined amount of chemical from the chemical storing container 34 into pure water flowing through the cleaning solution supply pipe 33. The temperature of the cleaning solution in the cleaning bath 30 is detected by, e.g., a temperature sensor 44. On the basis of a detection signal outputted from the temperature sensor 44, the amount of the chemical injected by the diaphragm pump 37 is controlled so that the concentration of the chemical is a predetermined concentration. Thus, a predetermined amount of chemical can be injected so as to clean the wafer W with a predetermined concentration of chemical.

16 Claims, 13 Drawing Sheets

45
CPU
37A
34a
34
38
41
42
43
T
44
W
40
P
37
30c
39
17
30g
30f
30b
30a
30
36
32
30a
32
30e
35
31
30d
33
47
46

CLEANING METHOD AND CLEANING EQUIPMENT

BACKGROUND OF THE INVENTION

1. Field of the Invention

The present invention relates generally to a cleaning method and equipment for dipping an object to be treated, such as a semiconductor wafer or a glass substrate for a LCD, into a cleaning solution, such as a chemical or pure water, to clean the object.

2. Related Background Art

In a typical production process for a semiconductor equipment, there is widely adopted a cleaning equipment for sequentially dipping objects to be treated, such as semiconductor wafers or glasses for LCDs, (which will be hereinafter referred to as "wafers"), into a cleaning solution, e.g., a chemical, such as aqueous ammonia ($NH_4OH$) or hydrofluoric acid (HF), and/or a rinsing solution (pure water), which are stored in a cleaning bath, to clean the objects.

As a conventional cleaning equipment of this type, there is widely used a cleaning equipment wherein a cleaning bath for storing therein a cleaning solution to dip objects to be treated into the cleaning solution to clean the surfaces thereof is connected to a pure water supply source by means of a cleaning solution supply pipe which is connected to a chemical storing container for storing therein a chemical, the chemical in the chemical storing container being pressurized by an inert carrier gas, such as nitrogen ($N_2$), to be injected into pure water flowing through the cleaning solution supply line so that a predetermined concentration of chemical is supplied to the cleaning bath to clean the objects.

However, in the conventional cleaning equipment of this type, since the chemical stored in the chemical storing container is pressurized by the inert gas, such as $N_2$ gas, to be injected into the pure water line, the injection speed of the chemical injected into the pure water line is set to be constant, so that there is a problem in that it is difficult to change the injection speed within a short time.

Therefore, there are problems in that it is not possible to quickly and appropriately control the injection speed of the chemical in order to obtain an appropriate concentration of cleaning solution corresponding to the conditions of the objects to be treated, and it is not possible to sufficiently supply the appropriate concentration of cleaning solution corresponding to the conditions of the objects to be treated, so that cleaning efficiency and yields deteriorate.

SUMMARY OF THE INVENTION

It is therefore an object of the present invention to eliminate the aforementioned problems and to provide a cleaning method and equipment which can improve cleaning efficiency by injecting a predetermined amount of chemical into pure water to use a predetermined concentration of cleaning solution corresponding to the conditions of objects to be treated.

It is another object of the present invention to provide a cleaning method and equipment which can improve treatment efficiency with a simple construction and which can decrease the number of gas-liquid surface passages to decrease the amount of adhered particles and to improve etching uniformity.

In order to accomplish the aforementioned and other objects, according to one aspect of the present invention, a cleaning method comprises the steps of: dipping an object to be treated, into pure water to clean the object; and thereafter, controlling the concentration of a chemical in a cleaning solution which is prepared by injecting the chemical into the pure water, and dipping the object into the cleaning solution to clean the object.

Thus, after the object is dipped in the pure water to be cleaned, when the object is dipped in the cleaning solution, which is prepared by injecting the chemical into the pure water, to be cleaned, the concentration of the chemical in the cleaning solution can be changed to a predetermined concentration within a short time. Therefore, it is possible to improve the chemical cleaning efficiency for the object and it is possible to improve the throughput for the whole cleaning.

The amount of the chemical injected into the pure water may be changed on the basis of the temperature of the cleaning solution to control the concentration of the chemical in the cleaning solution. Thus, the concentration of the cleaning solution can be the optimum concentration based on the environment temperature of the object, so that it is possible to improve the chemical cleaning efficiency for the object and it is possible to improve the throughput for the whole cleaning.

The amount of the chemical injected into the pure water may be changed step-wise during one step, to control the concentration of the chemical in the cleaning solution. Thus, during the step of dipping the object in the cleaning solution, which is prepared by injecting the chemical into the pure water, to clean the object, a large amount of chemical can be injected at the initial stage of the cleaning step to prepare a high concentration of cleaning solution by gradually changing the amount of the injected chemical. Therefore, it is possible to reduce the time for unstable concentration of the cleaning solution diluted by dipping the object, and it is possible to improve cleaning efficiency.

The amount of the chemical injected into the pure water may be changed on the basis of the amount of the pure water supplied, to control the concentration of the chemical in the cleaning solution. Thus, the optimum concentration of cleaning solution based on the amount of the supplied pure water can be prepared by changing the amount of the injected chemical on the basis of the amount of the supplied pure water. Therefore, it is possible to improve the chemical cleaning efficiency for the object, and it is possible to improve the throughput for the whole cleaning.

According to another aspect of the present invention, there is provided a cleaning method for dipping an object to be treated, into a cleaning solution stored in a cleaning bath, to clean the surface of the object, the cleaning method comprising the steps of: a first cleaning step for injecting a chemical, which is diluted to a predetermined concentration with pure water continuously supplied in said cleaning bath, into said cleaning solution and for allowing said cleaning solution in said cleaning bath to overflow to clean said object; a second cleaning step for controlling the temperature of the diluted chemical in the cleaning bath so as to be a predetermined temperature and circulating the diluted chemical to clean the object while the supply of both of the pure water and the chemical is stopped when the concentration of the diluted chemical reaches a predetermined concentration; and a third cleaning step for allowing the pure water to overflow in the cleaning bath to clean the chemical adhered to the object.

Thus, when the concentration of the diluted chemical reaches a predetermined concentration after the chemical cleaning, while the supply of both of the pure water and the chemical is stopped, the temperature of the diluted chemical in the cleaning bath is controlled to be a predetermined temperature, and the diluted chemical is circulated to clean the object. Thus, it is possible to reduce consumption of the chemical, and it is possible to effectively utilize the chemical and to reduce the amount of adhered particles.

The cleaning method may further comprise a step for allowing the pure water to overflow to clean the object before said first cleaning step. Thus, when the concentration of the diluted chemical reaches a predetermined concentration after the pure water cleaning and the chemical cleaning, while the supply of both of the pure water and the chemical is stopped, the temperature of the diluted chemical in the cleaning bath is controlled, and the diluted chemical is circulated to clean the object. Thus, it is possible to reduce consumption of the chemical, and it is possible to effectively utilize the chemical and to reduce the amount of adhered particles.

According to a further aspect of the present invention, a cleaning equipment comprises: a cleaning bath for storing therein a cleaning solution and for allowing an object to be treated, into the cleaning solution to clean the surface of the object; a cleaning solution supply pipe for connecting the cleaning bath to a pure water supply source; a chemical storing container for storing therein a chemical; a chemical supply pipe for connecting the cleaning solution supply pipe to the chemical storing container; shut-off means for selectively opening and closing the chemical supply pipe; chemical supply means for supplying the chemical from the chemical storing container to pure water flowing through the cleaning solution supply pipe; and chemical concentration control means for controlling the concentration of the chemical in the cleaning solution.

Thus, a predetermined concentration of cleaning solution can be prepared within a short time by controlling the concentration of the chemical in the cleaning solution, so that it is possible to improve the chemical cleaning efficiency for the object and to improve the throughput for the whole cleaning.

The cleaning equipment may further comprise temperature detecting means for detecting the temperature of the cleaning solution in the cleaning bath, and the chemical concentration control means may control the concentration of the chemical in the cleaning solution on the basis of a detection signal outputted from the temperature detecting means. Thus, the optimum temperature of cleaning solution based on the environment temperature of the object can be prepared by changing the amount of the injected chemical on the basis of the temperature of the cleaning solution, so that it is possible to improve the chemical cleaning efficiency for the object and to improve the throughput for the while cleaning.

The cleaning equipment may further comprise pure water flow detecting means, provided in the cleaning solution supply pipe, for detecting the flow rate of the pure water supplied to the cleaning bath, and the chemical concentration control means may control the concentration of the chemical in the cleaning solution on the basis of a detection signal outputted from the pure water flow detecting means. Thus, the optimum concentration of cleaning solution based on the environment temperature of the object can be obtained by changing the amount of the injected chemical on the basis of the temperature of the cleaning solution, so that it is possible to improve the chemical cleaning efficiency for the object and to improve the throughput for the whole cleaning.

The cleaning bath may have an inner bath for storing therein the cleaning solution to allow the object to be dipped therein, and an outer bath for covering an outer end portion of an opening portion of the inner bath, and the cleaning equipment may further comprise: a circulating line for connecting the bottom of the outer bath to a cleaning solution supply part provided in the inner bath; and a circulating pump, a temperature control mechanism and a filter, which are provided in the circulating line. Thus, the temperature of the chemical stored in the cleaning bath can be controlled to be a predetermined temperature, and the chemical can be circulated and supplied while carrying out the filtering, so that it is possible to reduce consumption of the chemical and to effectively utilize the chemical.

The chemical supply means may have a diaphragm pump. Thus, it is possible to simply and accurately supply the chemical from the chemical storing container to the pure water flowing through the cleaning solution supply pipe, by means of the diaphragm pump.

The chemical supply means may have gas supply means for supplying a chemical carrier gas into the chemical storing container. In this case, an inert gas may be used as the chemical carrier gas. Thus, it is possible to simply and accurately supply the chemical from the chemical storing container to the pure water flowing through the cleaning solution supply pipe, by means of the chemical carrier gas.

The gas supply means may have a gas supply pipe for connecting the chemical storing container to a gas supply source, and the chemical concentration control means may have gas pressure control means, provided in the gas supply pipe, for controlling the pressure of the chemical carrier gas in the chemical storing container. Thus, if a gas having a pressure preset by the gas pressure control means is supplied to the chemical in the chemical storing container, a predetermined amount of chemical can be mixed into the pure water supplied to the cleaning bath, so that a predetermined concentration of chemical can be stored in the cleaning bath. Therefore, the predetermined concentration of chemical can be supplied to the cleaning bath only by controlling the gas pressure, so that it is possible to remove particles, metal contamination substances or natural oxide films which are adhered to the surface of the object.

The cleaning equipment may further comprise pure water flow detecting means, provided in the cleaning solution supply pipe, for detecting the flow rate of the pure water supplied to the cleaning bath, and the gas pressure control means may control the pressure of the chemical carrier gas in the chemical storing container, on the basis of a detection signal outputted from the pure water flow detecting means. Thus, the fluctuation of the flow rate of the pure water can be detected by the pure water flow detecting means, and the gas pressure control means can be controlled on the basis of the detection signal of the pure water flow detecting means, so that it is possible to supply an accurately controlled concentration of chemical to the cleaning bath.

The chemical carrier gas may be an inert gas. Thus, it is possible to maintain a chemically stable chemical carrier gas.

The gas supply means may have a gas supply pipe for connecting the chemical storing container to a gas supply source, and the cleaning equipment may further comprise a gas control branch line of a plurality of shut-off means and diaphragm mechanisms which are provided in the gas supply pipe, each of the shut-off means being selectively open and closed. In this case, the gas control branch lines may be arranged in parallel or in series. Thus, the gas pressure control range can be increased by selectively opening and closing each of the shut-off means. Therefore, it is possible to supply an accurately controlled concentration of chemical to the cleaning bath.

The cleaning equipment may further comprise liquid level detecting means provided on the chemical storing container, and the chemical concentration control means may control to maintain the liquid level of the chemical in the chemical storing container to be always constant on the basis of a detection signal outputted from the liquid level detecting means. Thus, the amount of the chemical stored in the chemical storing container can be maintained to be constant. Therefore, the amount of the chemical injected into the pure water can be maintained to be constant without being influenced by the amount of the stored chemical, and the concentration of the chemical can be maintained to be constant.

The chemical storing container may comprise a tank which has a circular cross-section and a height of less than or equal to the diameter of the tank. Thus, the influence of the fluctuation of the amount of the chemical stored in the chemical storing container can be restricted, so that the amount of the chemical injected into the pure water can be maintained to be constant.

BRIEF DESCRIPTION OF THE DRAWINGS

The present invention will be understood more fully from the detailed description given herebelow and from the accompanying drawings of the preferred embodiments of the invention. However, the drawings are not intended to imply limitation of the invention to a specific embodiment, but are for explanation and understanding only.

In the drawings.

DESCRIPTION OF THE PREFERRED EMBODIMENTS

Referring now to the accompanying drawings, the preferred embodiments of the present invention will be described in detail below. In the undermentioned preferred embodiments, the present invention is applied to a cleaning system for semiconductor wafers.

Figure 1:
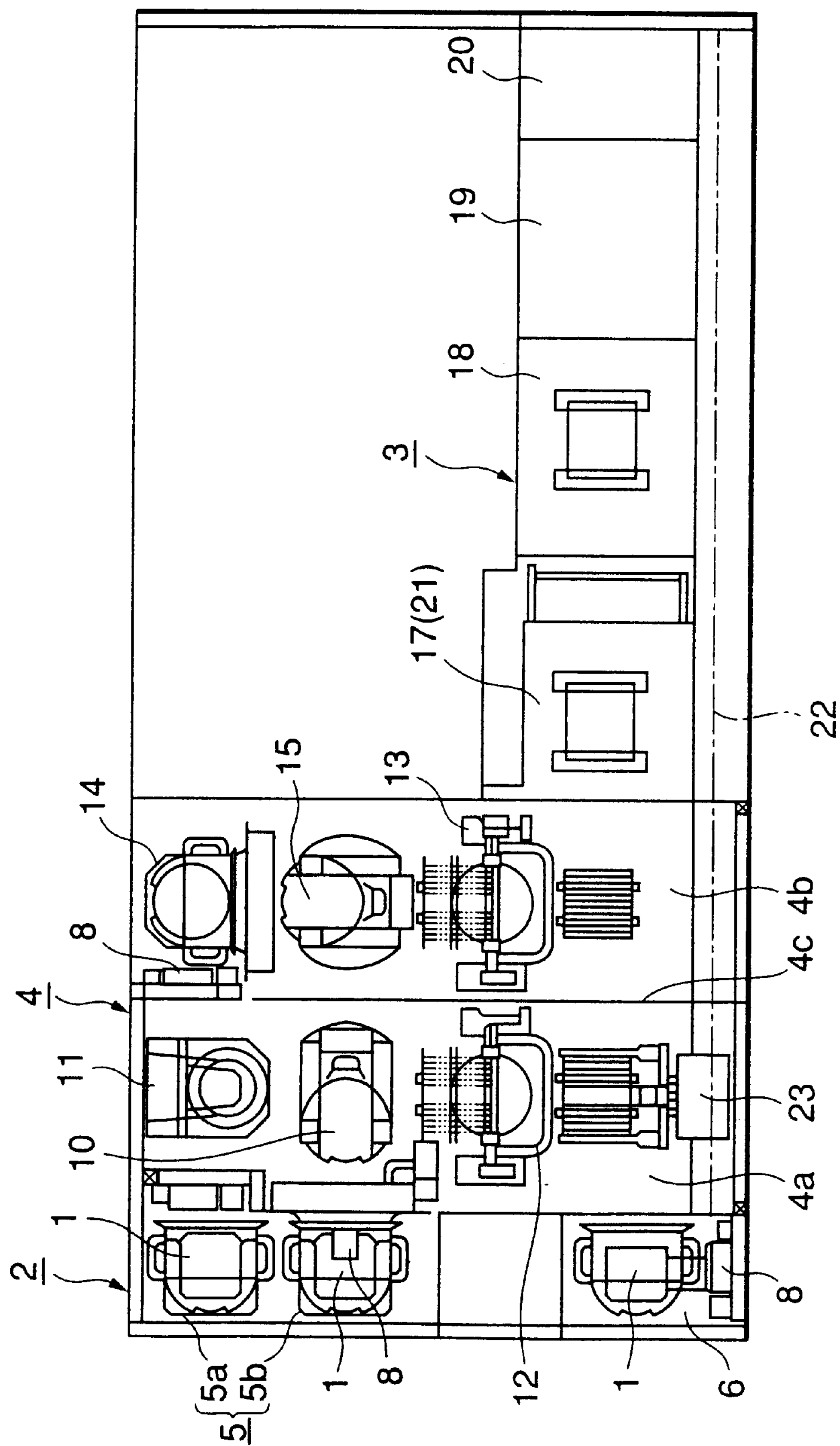
FIG. 1 is a schematic plan view of a cleaning system, to which a cleaning equipment according to the present invention is applied.
Figure 2:
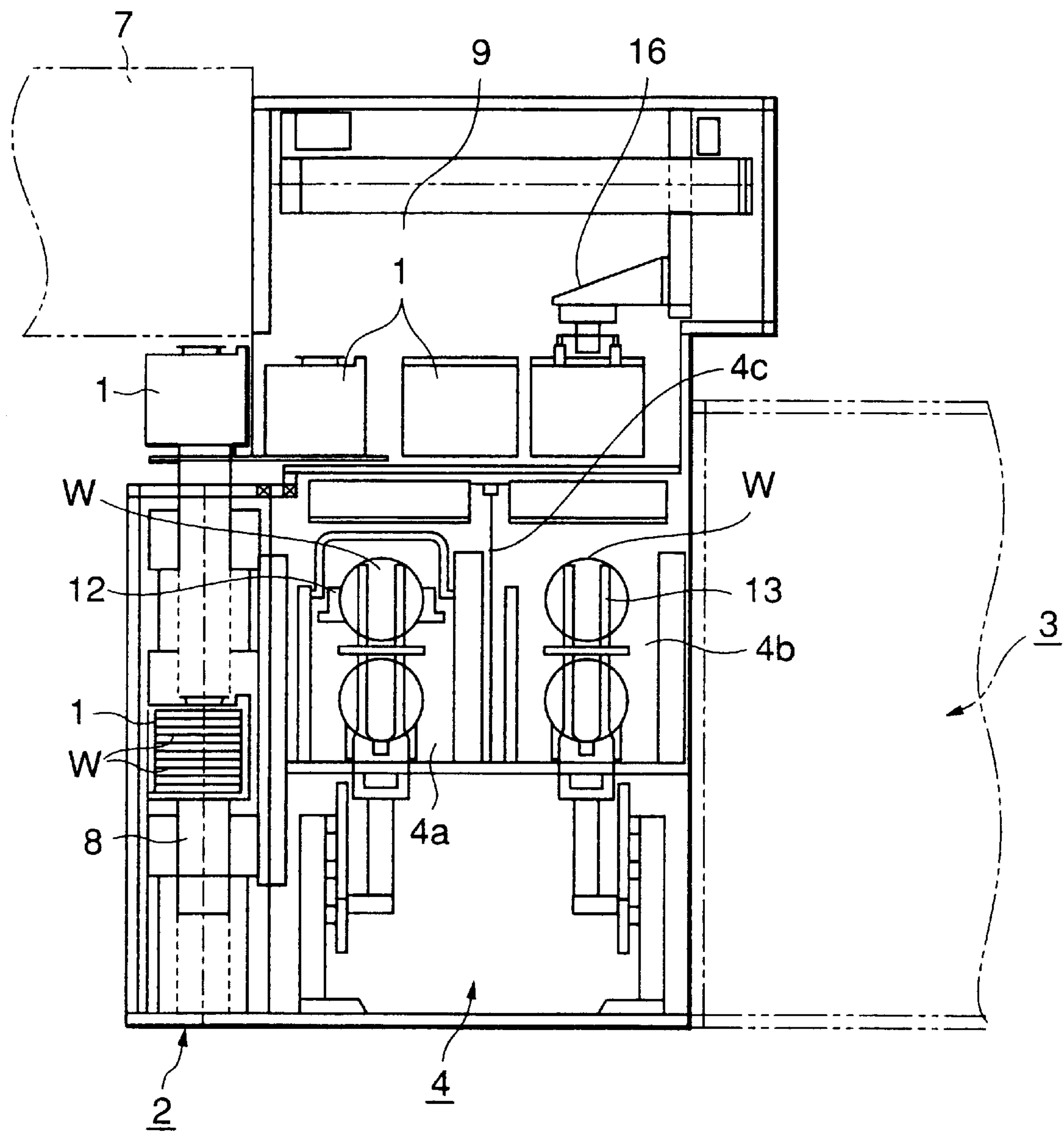
FIG. 2 is a schematic side elevation of a part of the cleaning system.

FIG. 1 is a schematic plan view showing an example of a cleaning system, to which a cleaning equipment according to the present invention is applied, and FIG. 2 is a schematic side elevation of a part of FIG. 1.

The cleaning system generally comprises: a transport section 2 for carrying in and out a container, e.g., a carrier 1, for horizontally housing therein semiconductor wafers W (which will be hereinafter referred to as "wafers") serving as objects to be treated; a treatment section 3 for treating the wafers W with solutions, such as a chemical and a cleaning solution, and for drying the wafers W; and an interface section 4, located between the transport section 2 and the treatment section 3, for delivering, positioning and attitude-converting the wafers W.

The transport section 2 comprises an introducing part 5 and a discharging part 6, which are provided on an end portion of one side of the cleaning system. The introducing part 5 comprises a receiving part 5*a* for receiving the carrier 1 from an upper transport mechanism 7, and a delivery part 51) for mounting the carrier 1 horizontally transported from the receiving part 5*a*. The delivery part 5*b* is provided with a carrier lifter 8 for transporting the carrier 1 between an upper position and an inlet (not shown) of the interface section 4. The discharging part 6 is also provided with a carrier lifter 8 for transporting the carrier 1 between an outlet (not shown) of the interface section 4 and an upper position. By these carrier lifters 8, the carrier 1 can be transported between the introducing pairs 5 or between the discharging parts 6, and an empty carrier 1 can be delivered to a carrier waiting part 9, which is provided above the interface section 4, and received from the carrier waiting part 9 (see FIG. 2).

The interface section 4 is divided into a first chamber 4*a*, which is adjacent to the transport section 2, and a second chamber 4*b*, which is adjacent to the treatment section 3, by a partition wall 4*c*. The first chamber 4*a* houses therein: a wafer unloading aim 10 which is movable in horizontal directions (X, Y directions) and vertical directions (z direction) and rotatable (θ directions) for unloading a plurality of wafers W from the carrier 1 in the introducing part 5 (specifically in the delivery part 5*b*) to transport the wafers W; a space adjusting mechanism (not shown) for adjusting the spaces between the plurality of wafers W unloaded by the wafer unloading arm 10; and a first attitude changing unit 12 for changing the attitude of wafers W from a horizontal state to a vertical state.

The second chamber 4*b* houses therein: a second attitude changing unit 13 for changing the attitude of the wafers W, which have been received from a wafer transport chuck (which will be described later) 23 for transporting the plurality of treated wafers W from the treatment section 3 while maintaining the vertical state thereof, from the vertical state to the horizontal state; and a wafer loading arm 15 which is movable in horizontal directions (X, Y directions) and vertical directions (z direction) and rotatable (θ directions) for receiving the plurality of wafers W, which have been changed to the horizontal state by means of the second attitude changing unit 13, to load the wafers W in an empty carrier 1 transported to a wafer receiving part 14. Furthermore, the wafer receiving part 14 is provided with a carrier lifter 8 for transporting the carrier 1 between the wafer receiving part 14 and the carrier waiting part 9. The carrier waiting part 9 is provided with a carrier transport robot 16 for moving an empty carrier 1, from which the wafers W have been delivered by the wafer delivery part 5*b*, or the carrier 1, which houses therein the wafers W in the wafer receiving part 14 and which houses therein the wafers W transported from a predetermined waiting position or the wafer receiving part 14 to the carrier waiting part 9, to a position above the discharging part 6.

On the other hand, the treatment part 3 houses therein: a first treatment unit 19 for removing particles and organic contamination substances which are adhered to the wafers W; a second treatment unit 18 for removing metal contamination substances which are adhered to the wafers W; a third treatment unit 17 for removing oxide films which are adhered to the wafers W; and a chuck cleaning unit 20. The first, second and third treatment units 19, 18 and 17 and the chuck cleaning unit 20 are in alignment with each other. Furthermore, a drying unlit 21 is provided above the third treatment unit 17. In this case, a cleaning equipment according to the present invention is applied to the third treatment unit 17. In addition, a wafer transport chuck 23, which is movable in X and Y directions (horizontal directions) and Z directions (vertical directions) and rotatable (θ), is provided on a transport channel 22 which extends from the interface section 4 at a position facing the respective units 17 through 20.

A cleaning equipment according to the present invention will be described below.

[First Preferred Embodiment]

Figure 3:
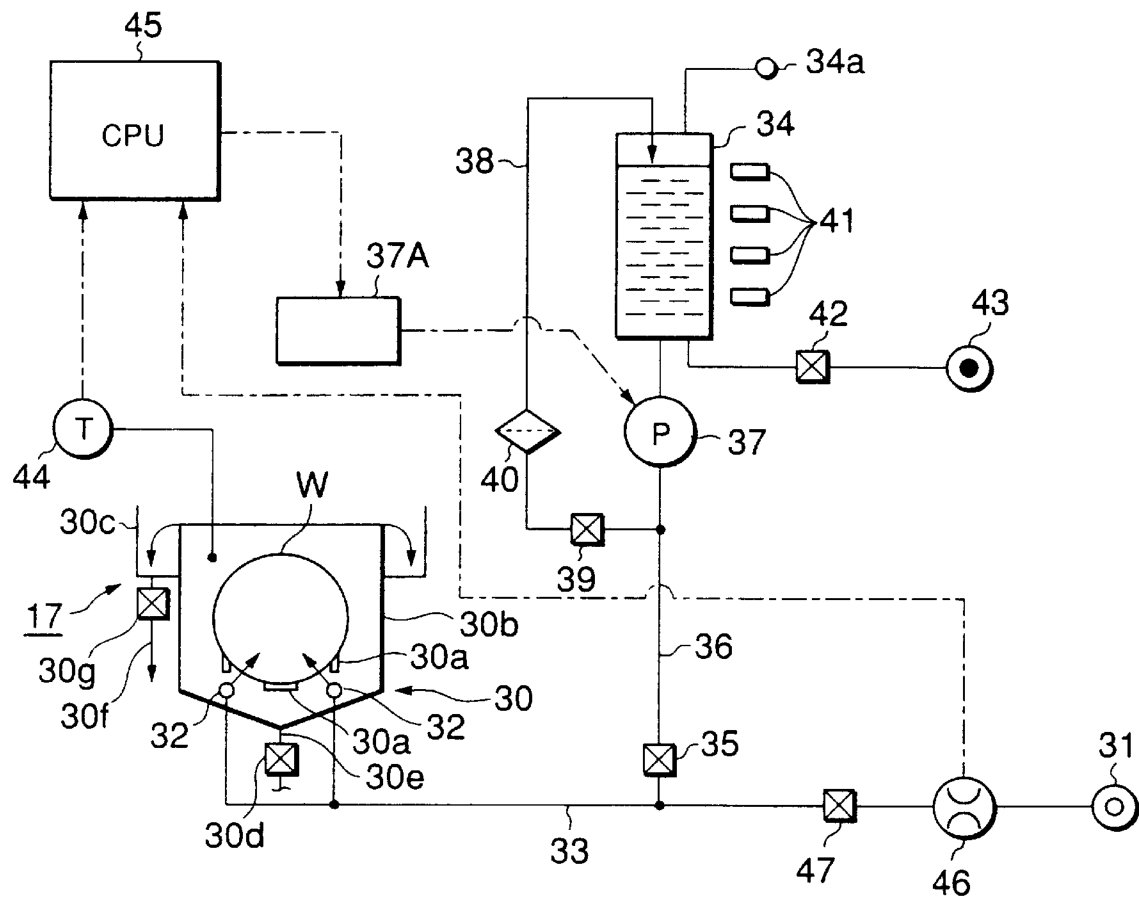
FIG. 3 is a schematic block diagram of the first preferred embodiment of a cleaning equipment according to the present invention.

FIG. 3 is a schematic block diagram of the first preferred embodiment of a cleaning equipment according to the present invention.

The cleaning equipment 17 comprises: a cleaning bath 30, which stores therein a cleaning solution, e.g., a chemical, such as a diluent (DHF) of hydrofluoric acid (HF), and/or a rinsing solution, such as pure water, and which allows objects to be treated, such as semiconductor wafers W (which will be hereinafter referred to as "wafers"), to be dipped in the cleaning solution to clean the surfaces of the objects; a cleaning solution supply pipe 33 for connecting a pure water supply source 31 to a cleaning solution supply nozzle 32 which is provided in the cleaning bath 30 for connecting the cleaning bath 30 to the pure water supply source 31; a chemical storing container 34 for storing therein a chemical, such as hydrofluoric acid (HF); a chemical supply pipe 36 for connecting the cleaning solution supply pipe 33 and the chemical storing container 34 via an injection shut-off valve (shut-off means) 35; and a chemical supply means, e.g., a diaphragm pump 37, which is provided in the chemical supply pipe 36.

The cleaning bath 30 comprises: an inner bath 30*b*, in which holding members 30*a* for holding a plurality of wafers W, e.g., 50 wafers W, are provided; and an outer bath 30*c* which covers the outer edge portion of the opening portion of the inner bath 30*b* for receiving the cleaning solution overflowing the inner bath 30*b*. Furthermore, a drain pipe 30*e*, in which a drain valve 30*d* is provided, is connected to the bottom of the inner bath 30*b*, and a waste pipe 30*f*, in which a shut-off valve 30*g* is provided, is connected to the bottom of the outer bath 30*c*.

A circulating line 38 is provided between the discharge side of the diaphragm pump 37, which is provided in the chemical supply line 38, and the chemical storing container 34. In the circulating line 38, a shut-off valve 39 and a filter 40 are provided so as to be arranged in that sequence from the pump discharge side to the chemical storing container 34. Thus, the pump discharge side and the side of the chemical storing container 34 are connected by means of the circulating line 38, and the shut-off valve 39 and the filter 40 are provided in the circulating line 38, so that the chemical, e.g., HF, which is stored in the chemical storing container 34 can be circulated while being filtered in a waiting stage that the injection of the chemical into pure water is stopped. Therefore, the waiting chemical can be always circulated and filtered to smoothly inject the chemical and to quantify the amount of the injected chemical. Furthermore, a level sensor 41 for detecting the liquid level of the chemical in the chemical storing container 34 is provided outside of the chemical storing container 34. A signal outputted from the level signal 41 is transmitted to a control means (not shown). On the basis of a control signal outputted from the control means, a chemical supply shut-off valve 42 is open so that the chemical is supplied from a chemical supply source 43 to the chemical storing container 34. Furthermore, the top of the chemical storing container 34 is formed with an air vent hole to be connected to an air vent part 34*a* via the air vent hole.

A temperature sensor 44 for detecting the temperature of the cleaning solution in the cleaning bath 30 is provided in the cleaning bath 30. A temperature signal outputted from the temperature sensor 44 is transmitted to a control means, e.g., a CPU (central processing unit) 45. On the basis of information previously stored in the CPU 45 and the processed control signal, a controller 37A of the diaphragm pump 37 is controlled so that a predetermined amount of chemical is injected into pure water flowing through the cleaning solution supply pipe 33.

On the other hand, in the cleaning solution supply pipe 33, a pure water flow detecting means, e.g., a flow meter 46, and a shut-off valve 47 are provided so as to be arranged in that sequence from the pure water supply source 31, in addition to the injection shut-off valve 35. A signal indicative of the amount of pure water outputted from the flow meter 46 is transmitted to the CPU 45. On the basis of information previously stored in the CPU 45 and the processed control signal, the controller 37A of the diaphragm pump 37 is controlled so that a predetermined amount of chemical is injected into pure water flowing through the cleaning solution supply pipe 33.

In the cleaning equipment with this construction, when the injection shut-off valve 35 is closed to establish the communication between the pure water supply source 31 and the cleaning bath 30, pure water is supplied from the pure water supply source 31 to the cleaning bath 30 via the cleaning solution supply pipe 33 and the cleaning solution supply nozzle 32 to be stored therein, and pure water overflows to clean a plurality of wafers W, e.g., 50 wafers W, which are housed in the cleaning bath 30.

Figure 4:
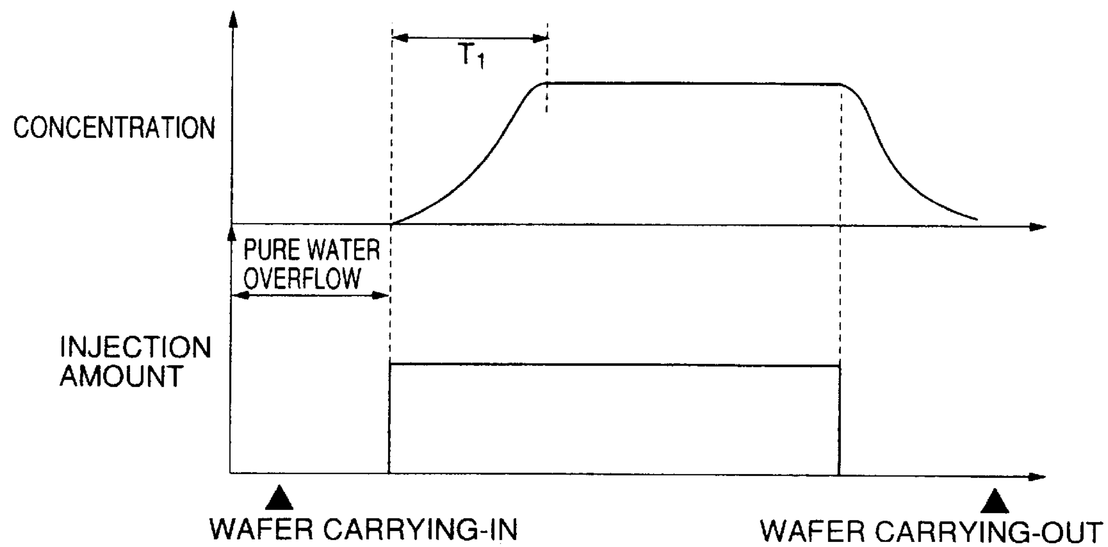
FIG. 4 is a timing chair showing the relationship between concentrations and injection amounts of a chemical in a cleaning method according to the present invention.
Figure 6:
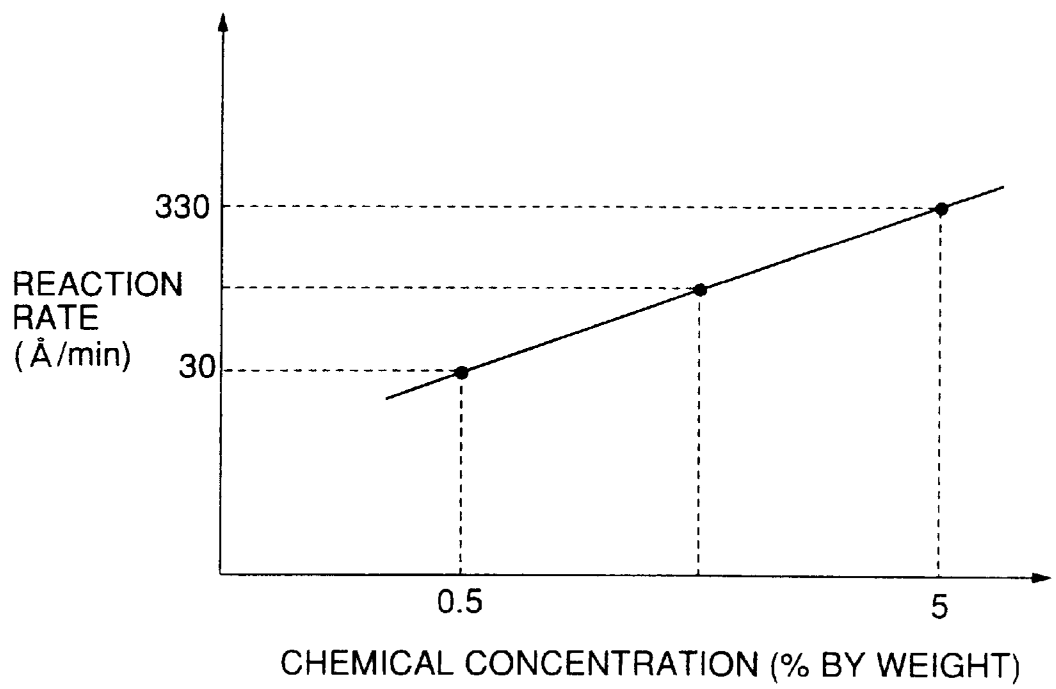
FIG. 6 is a graph showing the relationship between reaction rates and concentrations of a chemical.

When the chemical supply pipe 36 is open while the injection shut-off valve 35 is open to allow pure water to flow from the pure water supply source 31 and when the diaphragm pump 37 is driven in this condition, a predetermined amount of chemical, e.g., hydrofluoric acid (HF), flows from the chemical storing container 34 into the cleaning solution supply pipe 33 via the chemical supply pipe 36 to be diluted with pure water so that a predetermined concentration of chemical, i.e., diluted hydrofluoric acid (DHF), is supplied to the cleaning bath 30. In this case, the amount of injected HF can be suitably adjusted by driving and controlling the diaphragm pump 37. Thus, as shown in FIG. 4, the concentration of the DHF in the cleaning bath 30 can be maintained to be constant within a short time (T1). Thus, a predetermined concentration of DHF, which has been previously set by a simulator or the like, can be stored in the cleaning bath 30, and the DHF can overflow to remove particles, oxide films and so forth, which are adhered to the surfaces of the wafers W housed in the cleaning bath 30. In this case, a typical reaction rate Cal be expressed by the following formula.

$$v=A\times e^{aT} \quad (1)$$

wherein v denotes a reaction rate (/min), A denotes a concentration (% by weight) and T denotes a temperature. Therefore, the reaction rate can be increased as shown in FIG. 6 by quickly increasing the concentration of the chemical to a predetermined concentration, which has been previously set by a simulator or the like. As a result, cleaning efficiency can be improved.

Figure 5:
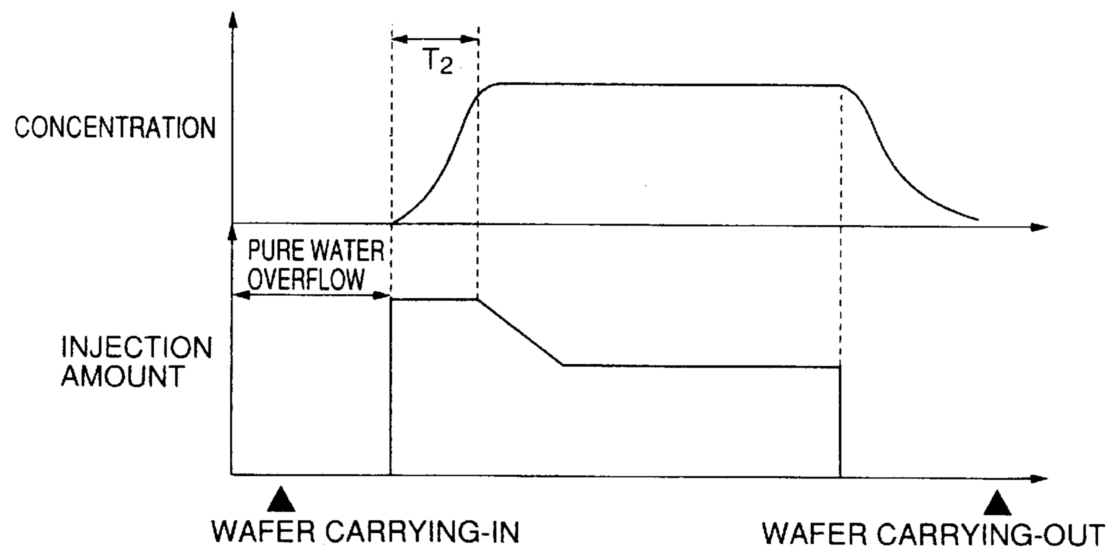
FIG. 5 is another timing chair showing the relationship between concentrations and injection amounts of a chemical in a cleaning method according to the present invention.

In the cleaning equipment with the above described concentration, the amount of the injected HF can be gradually changed during the cleaning process with the chemical. FIG. 5 shows an example of the amount of the injected HF gradually changed, which shows that the amount of the injected HF is transitionally increased at the initial stage of the cleaning process. As can be seen from the comparison of FIG. 5 with FIG. 4, the concentration of the DHF can be changed to a desired concentration within a shorter time T2(T2<T1) by gradually changing the amount of the injected HF. As a result, cleaning efficiency can be enhanced in comparison with the case shown in FIG. 4.

Figure 7:
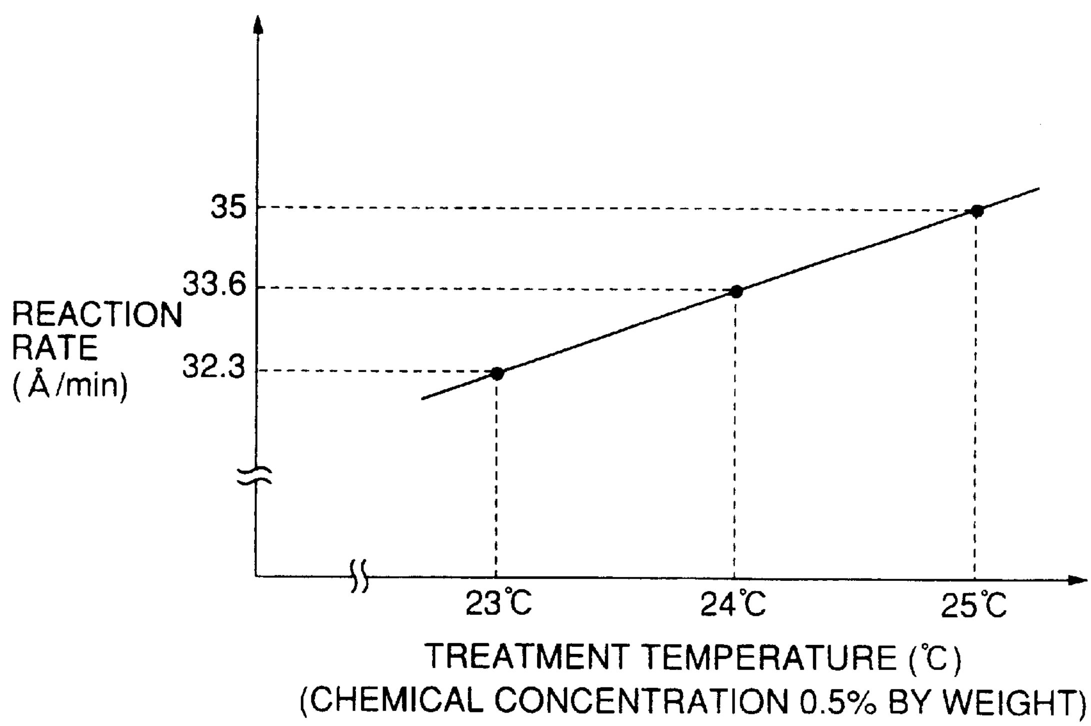
FIG. 7 is a graph showing the relationship between reaction rates and treatment temperatures.

If the temperature of the cleaning solution in the cleaning bath 30 is detected by the temperature sensor 44 to transmit a temperature signal to the CPU 45 to control the controller 37A of the diaphragm pump 37 on the basis of information previously stored in the CPU 45 and the processed control signal, a predetermined amount of HF can be injected into pure water flowing through the cleaning solution supply pipe 33, so that cleaning efficiency can be improved. In this case, since $v=A\times e^{aT}$, concentration A is increased by the decrease of temperature T so that reaction rate v is maintained to be constant. Therefore, as shown in FIG. 7, the reaction rate can be maintained to be —constant by raising the temperature of the chemical, so that cleaning efficiency and accuracy can be improved.

After the treatment is carried out with the chemical as described above, the injection shut-off valve 35 is operated to establish the communication between the pure water supply source 31 and the cleaning bath 30 again and to block the communication between the chemical supply pipe 36 and the cleaning bath 30. Thus, pure water can be supplied to the cleaning bath 30 to substitute pure water for the DHF to dip the wafers W in the pure water, and the pure water can overflow to remove the chemical, i.e., HF, which is adhered to the wafers W.

[Second Preferred Embodiment]

Figure 8:
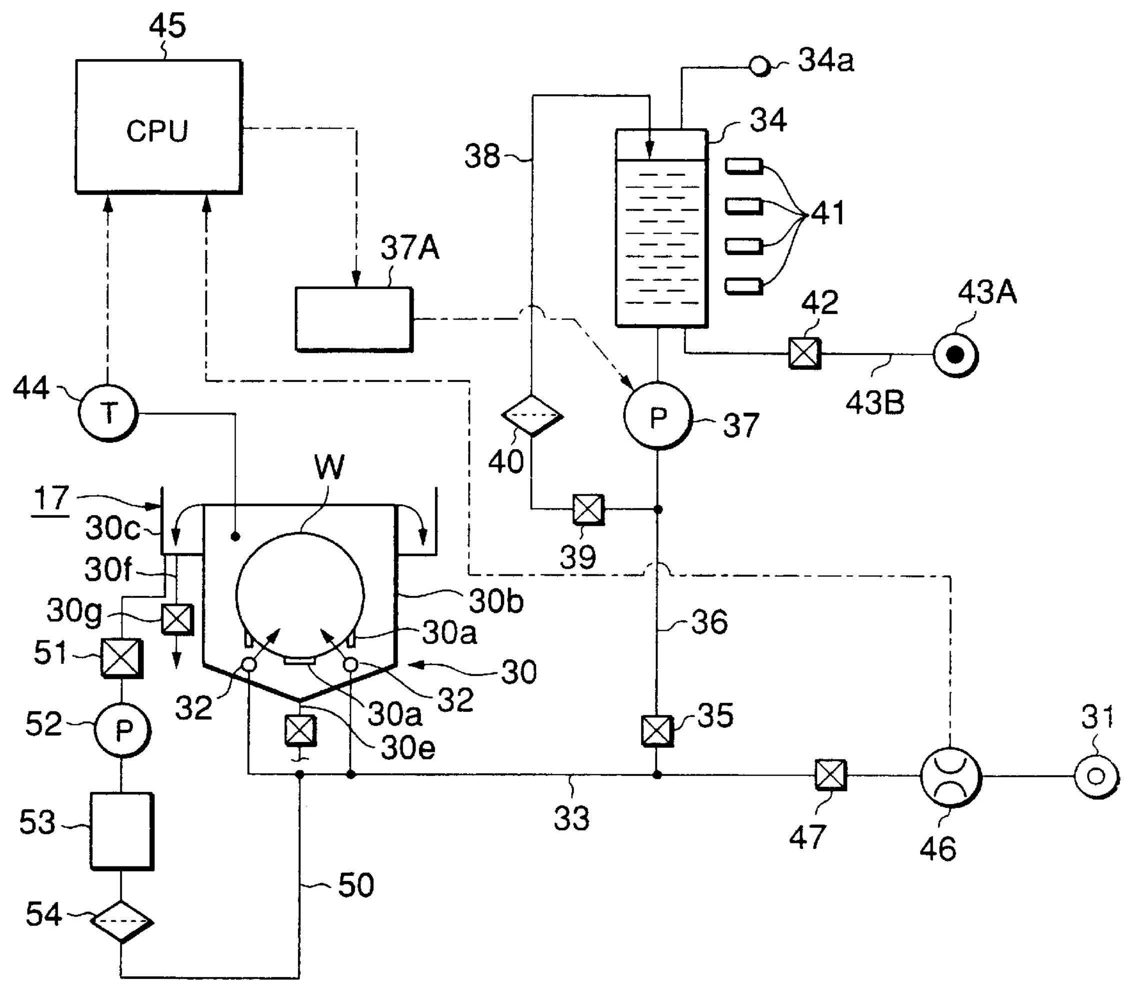
FIG. 8 is a schematic block diagram of the second preferred embodiment of a cleaning equipment according to the present invention.

FIG. 8 is a schematic block diagram of the second preferred embodiment of a cleaning equipment according to the present invention.

The second preferred embodiment is intended to reduce consumption of a chemical to effectively utilize the chemical.

That is, a discharge port formed in the bottom of an outer bath 30*c* forming a cleaning bath 30 is connected to a cleaning solution supply nozzle (cleaning solution supply part) 32, which is provided in the cleaning bath 30, by means of a circulating line 50. In this circulating line 50, a shut-off valve 51, a circulating pump 52, a temperature control mechanism 53 and a filter 54 are provided so as to be arranged in that sequence from the discharge port to the cleaning solution supply nozzle 32. Thus, a chemical, e.g., aqueous ammonia, which is stored in the cleaning bath 30, is circulated and supplied to remove metal contamination substances and organic substances which are adhered to the surfaces of the wafers W.

In the second preferred embodiment, other portions are the same as those in the above described first preferred embodiment, so that the same reference numbers are used for the same portions and the descriptions thereof are omitted.

In the cleaning equipment with the above described construction, after a chemical, e.g., DHF, which is stored in the cleaning bath 30, overflows to remove metal contamination substances, oxide films and so forth, which are adhered to the surfaces of the wafers W housed in the cleaning bath 30, an injection shut-off valve 35 and a shut-off valve 47 are closed and a shut-off valve 51 of the circulating line 50 is open. In addition, the circulating pump 52 is driven, so that the temperature control mechanism 53 controls the temperature of the DHF, which is stored in the cleaning bath 30, to be a predetermined temperature and so that the DHF passes through the filter 54 to be circulated and supplied to continue the removal of metal contamination substances or oxide films which are adhered to the surfaces of the wafers W dipped in the DHF.

Thus, after the treatment is carried out with the chemical, the shut-off valve 47 is open to establish the communication between a pure water supply source 31 and the cleaning bath 30, and the injection shut-off valve 35 remains being closed to block the communication between a chemical supply pipe 36 and the cleaning bath 30, so that pure water is supplied to the cleaning bath 30 to substitute the DHF for the pure water to dip the wafers W into the pure water and overflows to remove the chemical, i.e., HF, which is adhered to the wafers W.

As described above, after the pure water overflows in the cleaning bath 30 to clean the wafers W, the chemical, e.g., DHF, which is diluted to a predetermined concentration, overflows into the pure water, which is continuously supplied to the cleaning bath 30, to clean the wafers W. Thereafter, the supply of the DHF is stopped, and the DHF stored in the cleaning bath 30 is circulated and supplied to clean the wafers W while controlling the temperature of the DHF and carrying out the filtering. Then, the pure water overflows in the cleaning bath 30 again to clean HF which is adhered to the wafers W. Thus, although the inplane uniformity of the wafers W deteriorates when the pure water is substituted for the DHF, the uniformity is recovered by substituting the DHF for the pure water again, so that it is possible to obtain high etching uniformity and to improve cleaning efficiency.

In addition, the chemical, e.g., DHF, which is stored in the cleaning bath 30, is circulated and supplied while controlling the temperature of the chemical and carrying out the filtering, so that it is possible to reduce consumption of the DHF and to effectively utilize the DHF.

Furthermore, in the first and second preferred embodiments, while the chemical supply means has comprised the diaphragm pump 37, the present invention should not be limited thereto, but a reciprocating pump, such as a bellows pump, may be used. Alternatively, in place of the diaphragm pump, a predetermined amount of inert gas, e.g., $N_2$ gas, may be supplied to the chemical in the chemical storing container 34 to supply a predetermined amount of chemical.

In the above described preferred embodiments, while the cleaning equipment of the present invention has been applied to the third treatment unit 17, it may be applied to the first or second treatment unit 19 or 18 (see FIG. 1).

In the above described preferred embodiments, while the cleaning equipment and method of the present invention have been applied to the cleaning system for semiconductor wafers, the invention may be applied to a cleaning system for glass substrates for LCDs.

As described above, according to the above described preferred embodiments, the following excellent advantages can be obtained.

(1) After the objects to be treated are dipped in the pure water to be cleaned, when the objects to be treated are dipped in the cleaning solution, which is prepared by injecting the chemical into the pure water, to be cleaned, it is possible to obtain a predetermined concentration of cleaning solution within a short time by changing the concentration of the chemical in the cleaning solution. Therefore, it is possible to improve the chemical cleaning efficiency for the objects and the throughput for the whole cleaning.

(2) After the objects to be treated are dipped in the pure water to be cleaned, when the objects to be treated are dipped in the cleaning solution, which is prepared by injecting the chemical into the pure water, to be cleaned, the optimum concentration of cleaning solution based on the environment temperature of the objects can be obtained by changing the amount of the injected chemical on the basis of the temperature of the cleaning solution. Therefore, it is possible to improve the chemical cleaning efficiency for the objects and the throughput for the whole cleaning.

(3) After the objects to be treated are dipped in the pure water to be cleaned, while the objects to be treated are dipped in the cleaning solution, which is prepared by injecting the chemical into the pure water, to be cleaned, a great amount of chemical can be injected at the initial stage of the cleaning process to provide a high concentration of cleaning solution by gradually changing the amount of the injected chemical. Therefore, it is possible to reduce the time for unstable concentration of the cleaning solution diluted by the dipping of the objects, and it is possible to improve cleaning efficiency.

(4) After the objects to be treated are dipped in the pure water to be cleaned, when the objects to be treated are dipped in the cleaning solution, which is prepared by injecting the chemical into the pure water, to be cleaned, the optimum concentration of cleaning solution based on the amount of the supplied pure water can be obtained by changing the amount of the injected chemical on the basis of the amount of the supplied cleaning solution. Therefore, it is possible to improve the chemical cleaning efficiency for the objects and the throughput for the whole cleaning.

(5) The chemical stored in the cleaning bath can be circulated and supplied while controlling the temperature of the chemical by the temperature control mechanism to a predetermined temperature and while carrying out the filtering. Therefore, in addition to the advantages described in (1), it is possible to reduce consumption of the chemical and it is possible to effectively utilize the chemical.

Another preferred embodiment according to the present invention will be described below.

First, a conventional cleaning equipment relating to this preferred embodiment will be described.

Figure 15:
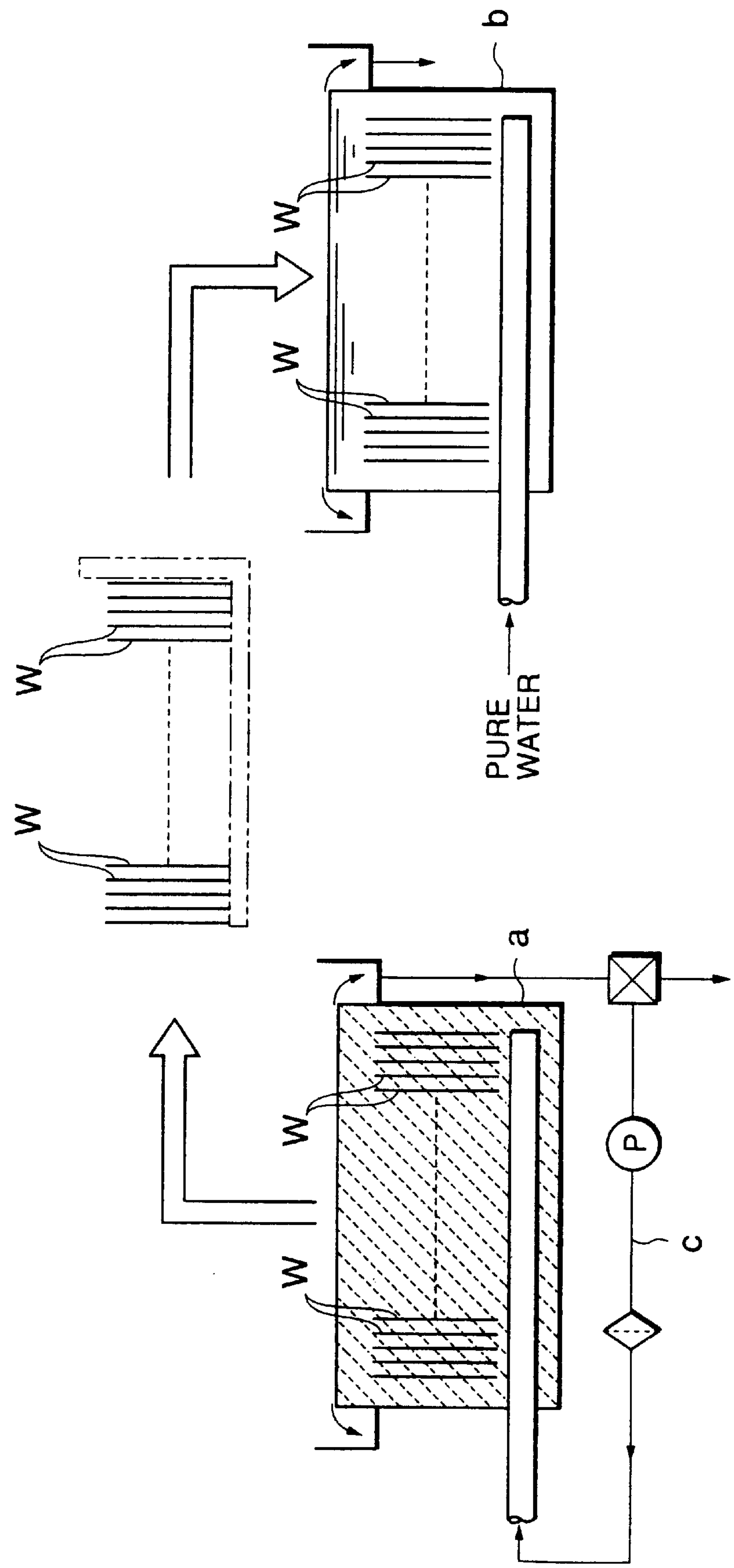
FIG. 15 is a schematic view showing an example of the procedure for a conventional cleaning method.

As shown in FIG. 15, the conventional cleaning equipment comprises: a chemical bath a which stores therein a chemical, e.g., diluted hydrofluoric acid (DHF), and which circulates and supplies the chemical; and a cleaning bath b which stores therein a rinsing solution, e.g., pure water, which overflows the cleaning bath b. According to this cleaning equipment, objects to be treated, e.g., wafers W, are dipped in the diluted hydrofluoric acid (DHF), which is stored in the chemical bath a and which is circulated and supplied via a circulating pipe c provided on the chemical bath a, so that it is possible to remove particles, which are adhered to the surfaces of the wafers W, heavy metals, such as Ni and Cr, or natural oxide films, which are chemically and physically absorbed to the surfaces of the wafers W. Thereafter, —the wafers W are taken out of the chemical bath a to be transported into the cleaning bath b to be stored in the cleaning bath b, and the wafers W are dipped in overflowing pure water, so that the chemical adhered to the surfaces of the wafers W can be removed. However, the conventional cleaning equipment of this type has a plurality of treatment baths, i.e., the chemical bath a and the cleaning bath b, and requires many piping installations and many piping apparatuses, such as weighing tanks, pumps, dampers, filters and valves, for chemicals and pure water, so that there is a problem in that the equipment is large and the installation costs are large. In addition, since the number of gas-liquid surface passages of the objects to be treated, e.g., the wafers W, is large, it is required to consider the possibility of adhesion of particles to the wafers W and the uniformity of etching. In view of the above described circumstances, the undermentioned preferred embodiments have been made. According to the undermentioned preferred embodiments, it is possible to simplify the structure and to improve treatment efficiency. In addition, it is possible to reduce the number of gas-liquid surface passages to reduce the amount of adhered particles and to improve etching uniformity.

[Third Preferred Embodiment]

Figure 9:
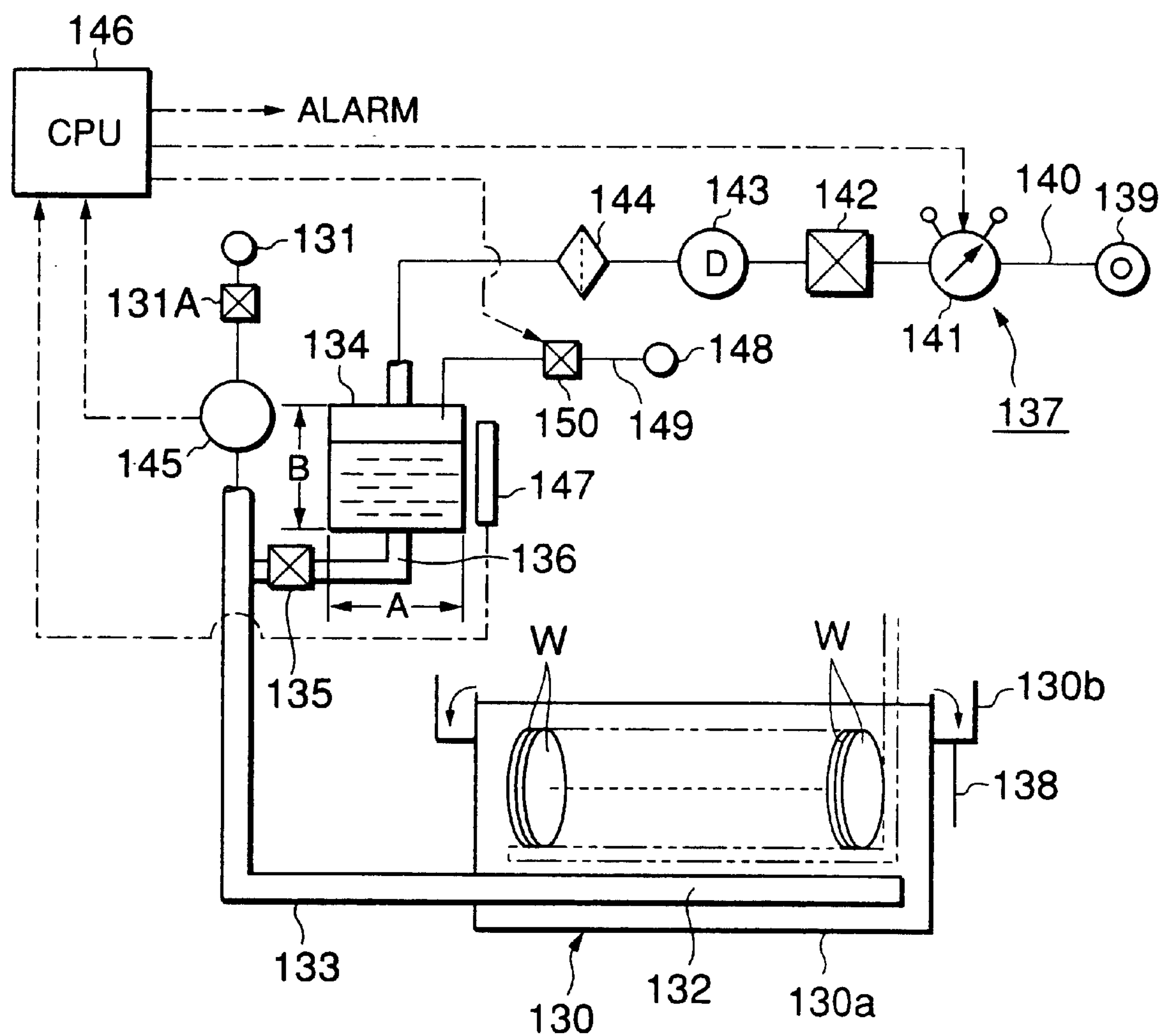
FIG. 9 is a schematic block diagram of the third preferred embodiment of a cleaning equipment according to the present invention.

FIG. 9 is a schematic block diagram of the third preferred embodiment according to the present invention.

The cleaning equipment 17 generally comprises: a cleaning bath 130 which stores therein a cleaning solution, e.g., a chemical, such as diluent (DHF) of hydrofluoric acid (HF), and/or a rinsing solution, such as pure water, and which allows objects to be treated, e.g., semiconductor wafers W (which will be hereinafter referred to as "wafers"), to be dipped into the cleaning solution to clean the surfaces of the wafers W; a cleaning solution supply pipe 133 for connecting a pure water supply source 131 to a cleaning solution supply nozzle 132 which is provided in the cleaning bath 130 for connecting the cleaning bath 130 to the pure water supply source 131; a chemical storing container 134 for storing therein a chemical, e.g., hydrofluoric acid (HF); a chemical supply pipe 136 for connecting the cleaning solution supply pipe 133 to the chemical storing container 134 via an injection shut-off valve (shut-off means) 135; and an $N_2$ gas supply means (gas supply means) 137 for supplying a chemical carrier gas, e.g., an inert gas, such as nitrogen ($N_2$) gas, to the chemical storing container 134. On the discharge port side of the pure water supply source 131 in the cleaning solution supply pipe 133, a shut-off valve 131A is provided.

The cleaning bath 130 comprises an inner bath 130*a* for storing therein the cleaning solution, and an outer bath 130*b* for covering the outer end poison of the opening portion of the inner bath 130*a*. A discharge pipe 138 is connected to a discharge port provided in the bottom of the outer bath 130*b*. The $N_2$ gas supply means 137 comprises: an $N_2$ gas supply pipe 140 for connecting the chemical storing container 134 to an $N_2$ gas supply source 139; and an $N_2$ gas pressure regulating means, e.g., a regulator 141, a shut-off valve 142, a pressure fluctuation absorbing damper 143 and a filter 144, which are provided in the $N_2$ gas supply pipe 140.

On the side of the pure water supply source 131 in the cleaning solution supply pipe 133, a pure water flow detecting means, e.g., a flow meter 145, is provided. A detection signal, which is outputted from the flow meter 145 and which is indicative of the flow rate of pure water flowing through the cleaning solution supply pipe 133, is transmitted to a control means, e.g., a central processing unit (CPU) 146. A control signal obtained by comparing and processing information previously stored in the CPU 146 is transmitted to the regulator 141 to operate the regulator 141. Furthermore, the CPU 146 is designed to give the alarm when some errors are caused in the flow meter 145.

The chemical storing container 134 is formed of, e.g., a cylindrical tank with bottom, which has a circular cross-section. The diameter A of the tank is greater than or equal to the height B of the tank ($A \geqq B$). Thus, if the diameter A of the chemical storing container 134 is greater than or equal to the height B of the chemical storing container 134, the influence of the fluctuation of the amount of the chemical (HF) stored in the chemical storing container 134 can be restricted, so that the amount of the chemical (HF) injected into the pure water can be maintained to be constant.

Outside of the chemical storing container 134, there is provided a liquid level detecting means, e.g., a level sensor 147, for detecting the liquid level of the chemical, i.e., HF, which is stored in the chemical storing container 134. A detection signal outputted from the level sensor 147 is transmitted to the CPU 146. On the basis of a control signal outputted from the CPU 146, a shut-off valve 150 provided in an HF supply pipe 149 for connecting an HF supply source 148 to the chemical storing container 134 can be open and closed. With this construction, the amount of HP stored in the chemical storing container 134 can be maintained to be constant. Therefore, the amount of the HF injected into the pure water can be maintained to be constant without being influenced by the amount of the stored HF, and the concentration of HF can be maintained to be constant.

In the cleaning equipment with the above described construction, if the injection shut-off valve 135 is closed and the pure water supply source 131 is communicated with the cleaning bath 130, the pure water can be supplied from the pure water supply source 131 to the cleaning bath 130 via the cleaning solution supply pipe 133 and the cleaning solution supply nozzle 132 to be stored in the cleaning( bath 130 and to overflow to clean a plurality of wafers W housed in the cleaning bath 130. In addition, the injection shut-off valve 135 is open to allow the chemical supply pipe 136 to be open while allowing the pure water to flow from the pure water supply source 131. In this state, the shut-off valve 142 provided in the $N_2$ gas supply pipe 140 is open, and the regulator 141 is operated to supply a predetermined pressure of $N_2$ gas, which has been previously set by a simulator, to the chemical storing container 134, so that a predetermined amount of chemical, i.e., HF, flows from the chemical storing container 134 into the cleaning supply pipe 133 via the chemical supply pipe 136 to be diluted with the pure water to supply a predetermine concentration of chemical, i.e., diluted hydrofluoric acid (DHF), to the cleaning bath 130. Thus, the predetermined concentration of DHF, which has been previously set by the simulator, can be stored in the cleaning bath 130, and can overflow into the outer bath 130*b* to remove particles and oxide films which are adhered to the surfaces of the wafers W housed in the cleaning bath 130.

[Fourth Preferred Embodiment]

Figure 10:
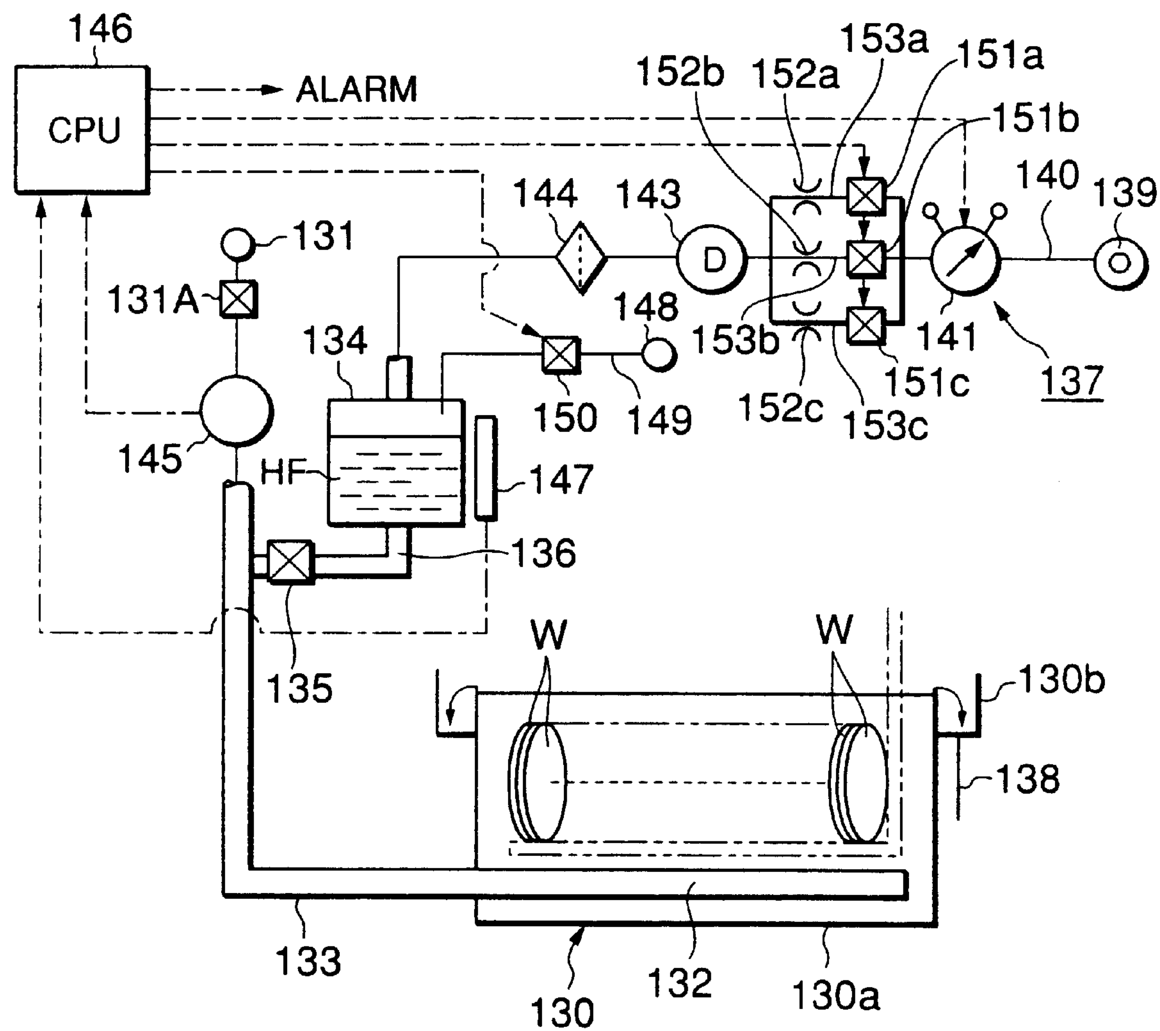
FIG. 10 is a schematic block diagram of the fourth preferred embodiment of a cleaning equipment according to the present invention.

FIG. 10 is a schematic block diagram of the fourth preferred embodiment of a cleaning equipment according to the present invention.

The fourth preferred embodiment is intended to increase the regulated range of $N_2$ gas pressure to allow the fine adjustment of the concentration of a chemical, e.g., HF. That is, in an $N_2$ gas supply pipe 140, a plurality of shut-off means (three shut-off means in the drawing), e.g., first through third shut-off valves 151*a* through 151*c*, and first through third $N_2$ gas adjusting branch lines 153*a* through 153*c* having diaphragm mechanisms, e.g., orifices 152*a* through 152*c*, are provided in parallel to each other. Each of the shut-off valve 151*a* through 151*c* is selectively formed so as to be capable of being open and closed.

With this construction, one of the shut-off valves 151*a* through 151*c* can be selectively open and closed, or some of the shut-off valves 151*a*, 151*b* and 151*c* can be simultaneously open and closed, so that the pressure of $N_2$ gas can be regulated to an optional preset pressure and the discharge amount of HF can be adjusted. Therefore, the concentration of the chemical (HF) can be finely adjusted, and a concentration of HF corresponding to the kind and number of wafers W can be supplied to carry out the chemical treatment. Alternatively, a method for opening all the shut-off valves 151*a* through 151*c* at a time to supply a high concentration of HF to the cleaning bath 130 to quickly start the chemical treatment may be adopted.

Furthermore, in the fourth preferred embodiment, while three $N_2$ gas adjusting branch lines 153*a* through 153*c* and three shut-off valves 151*a* through 151*c* have been used, two or four or more $N_2$ gas adjusting branch lines and shut-off valves may be provided.

Figure 11:
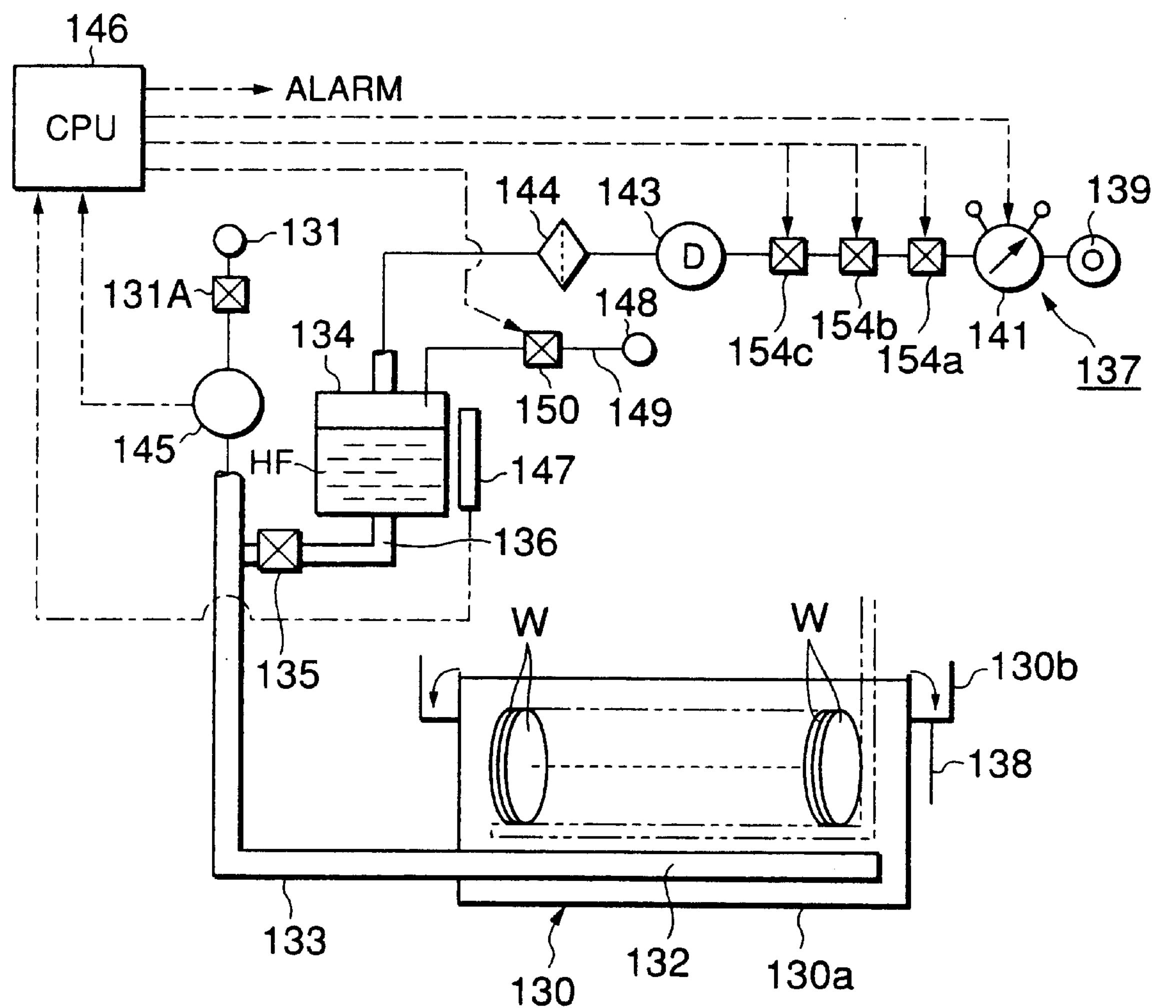
FIG. 11 is a schematic block diagram of a modification of the fourth preferred embodiment of a cleaning equipment according to the present invention.

In the fourth preferred embodiment, while the shut-off means have comprised the shut-off valves 151*a* through 151*c* and the orifices 152*a* through 152*c*, the shut-off means may comprise flow control valves. In addition, while the first through third $N_2$ gas adjusting branch lines 153*a* through 153*c* comprising the shut-off valves 151*a* through 151*c* and the orifices 152*a* through 152*c* as the shut-off means have been arranged in parallel to each other, it is not always required to arrange the $N_2$ gas adjusting branch lines in parallel to each other, but the $N_2$ gas adjusting branch lines may be arranged in series. That is, as shown in FIG. 11, a plurality of $N_2$ gas adjusting shut-off means (three shut-off means in the drawing), e.g., first through third valves 154*a* through 154*c* may be arranged in series.

In this case, the first valve 154*a* comprises a shut-off valve, the second valve 154*b* comprising a flow control valve capable of controlling the flow rate so as to be a large flow rate or a small flow rate, and the third valve 154*c* comprising a flow control valve capable of controlling the flow rate so as to be a large flow rate or a middle flow rate, so that the flow control (adjustment) can be carried out as follows. That is, when a small flow rate of $N_2$ gas is supplied, the first valve 154*a* is open, the second valve 154*b* being set to be the small flow rate, and the third valve 154*c* being set to be the middle flow rate. When a middle flow rate of $N_2$ gas is supplied, the first valve 154*a* is open, the second valve 154*b* being set to be the large flow rage, and the third valve 154*c* being set to be the middle flow rate. When a large flow rate of $N_2$ gas is supplied, the first valve 154*a* is open, the second valve 154*b* being set to be the large flow rate, and the third valve 154*c* being set to be the large flow rate. Furthermore, when the supply of $N_2$ gas is stopped, the first valve 154*a* may be closed.

In the fourth preferred embodiment, other portions are the same as those in the above described third preferred embodiment, so that the same reference numbers are used for the same portions and the descriptions thereof are omitted.

Figure 12A:
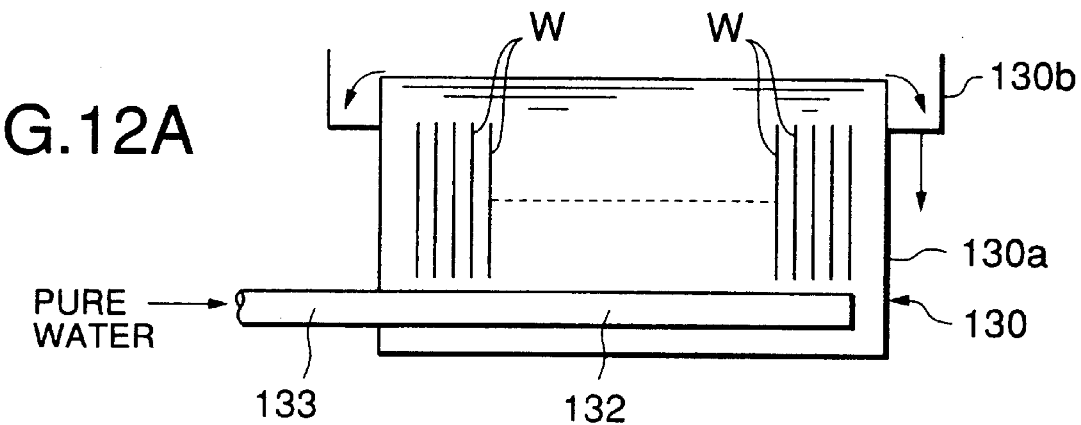
FIGS. 12(*a*), 12(*b*) and 12(*c*) are schematic views showing the procedure for a cleaning method using the third or fourth preferred embodiment of a cleaning equipment according to the present invention.
Figure 12B:
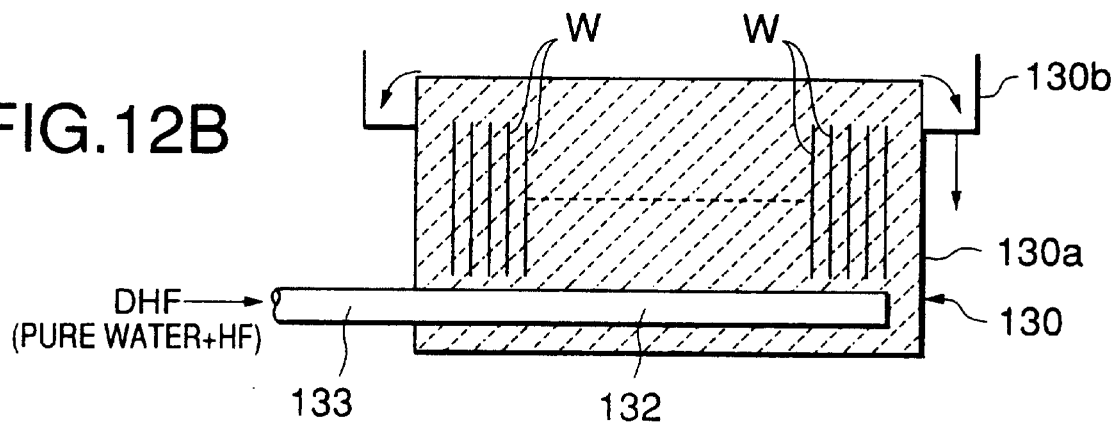
Figure 12C:
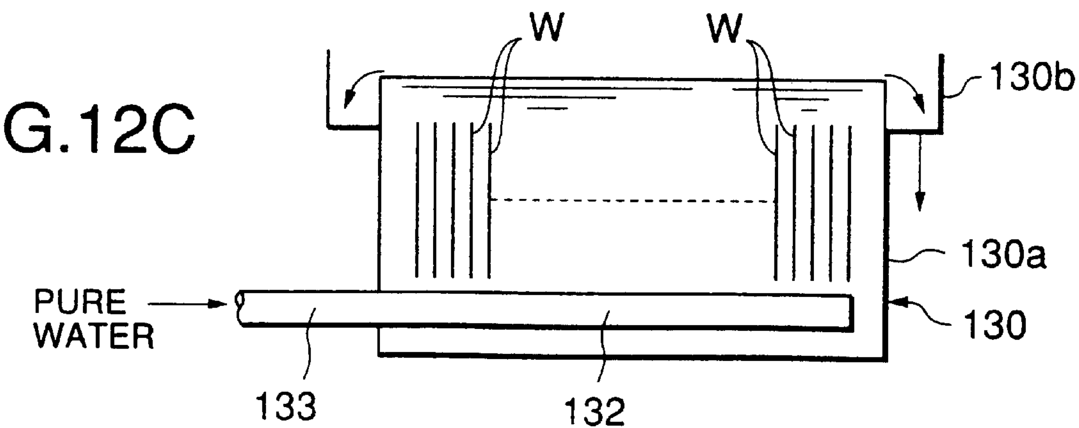

Referring to FIGS. 12(*a*), 12(*b*) and 12(*c*), an example of cleaning procedure using the third or fourth preferred embodiment of a cleaning equipment according to the present invention will be described below.

First, the injection shut-off valve 135 is closed to establish the communication between the pure water supply source 131 and the cleaning bath 130 to supply the pure water from the cleaning solution supply nozzle 132 to the cleaning bath 130 to store the pure water in the cleaning bath 130 to allow the wafers W to be dipped in the pure water and to allow the pure water to overflow (first cleaning step: FIG. 12(*a*)).

Then, the injection shut-off valve 135 is open to allow the chemical supply pipe 136 to be open while allowing the pure water to flow from the pure water supply source 131. In this state, when the shut-off valve 142 provided in the $N_2$ gas supply pipe 140 is open and when the regulator 141 is actuated or when the predetermined shut-off valves 151*a* through 151*c* or the valves 154*a* through 154*c* are open with the regulator 141, a predetermined pressure of $N_2$ gas is supplied to the chemical storing container 134. Thus, a predetermined amount of chemical, i.e., HF, flows from the chemical storing container 134 into the cleaning solution supply pipe 133 via the chemical supply pipe 136 to be diluted with the pure water, so that a predetermined concentration of chemical, i.e., diluted hydrofluoric acid (DHF), is supplied to the cleaning bath 130 to allow the wafers W to be dipped in the DHF. In addition, the DHF overflows into the outer bath 130*b* to remove metal contamination substances, which are adhered to the surfaces of the wafers W, or oxide films on the surfaces of the wafers W (second cleaning step: FIG. 12(*b*)).

Then, the injection shut-off valve 135 is closed to establish the communication between the pure water supply source 131 and the cleaning bath 130 again, and the shut-off valves 142, 151*a* through 151*c* and 154*a* are closed to supply the pure water to the cleaning bath 130 to substitute the DHF for the pure water to allow the wafers W to be dipped in the pure water and to allow the pure water to overflow to remove the chemical, i.e., HF, which is adhered to the wafers W (third cleaning step: FIG. 12(*c*)).

As described above, after the pure water is allowed to overflow to clean the wafers W in the cleaning bath 130, the chemical, e.g., HF, which is diluted to a predetermined concentration with the pure water continuously supplied to the cleaning bath 130, is allowed to overflow to clean the wafers W. Thereafter, the pure water is allowed to overflow in the cleaning bath 130 again to clean HF which is adhered to the wafers W. Thus, although the inplane uniformity of the wafers W deteriorates when the pure water is substituted for the DHF, the uniformity is recovered by substituting the pure water for the DHF again, so that it is possible to obtain high etching uniformity. Therefore, according to this cleaning method, it is possible to improve cleaning efficiency.

[Fifth Preferred Embodiment]

Figure 13:
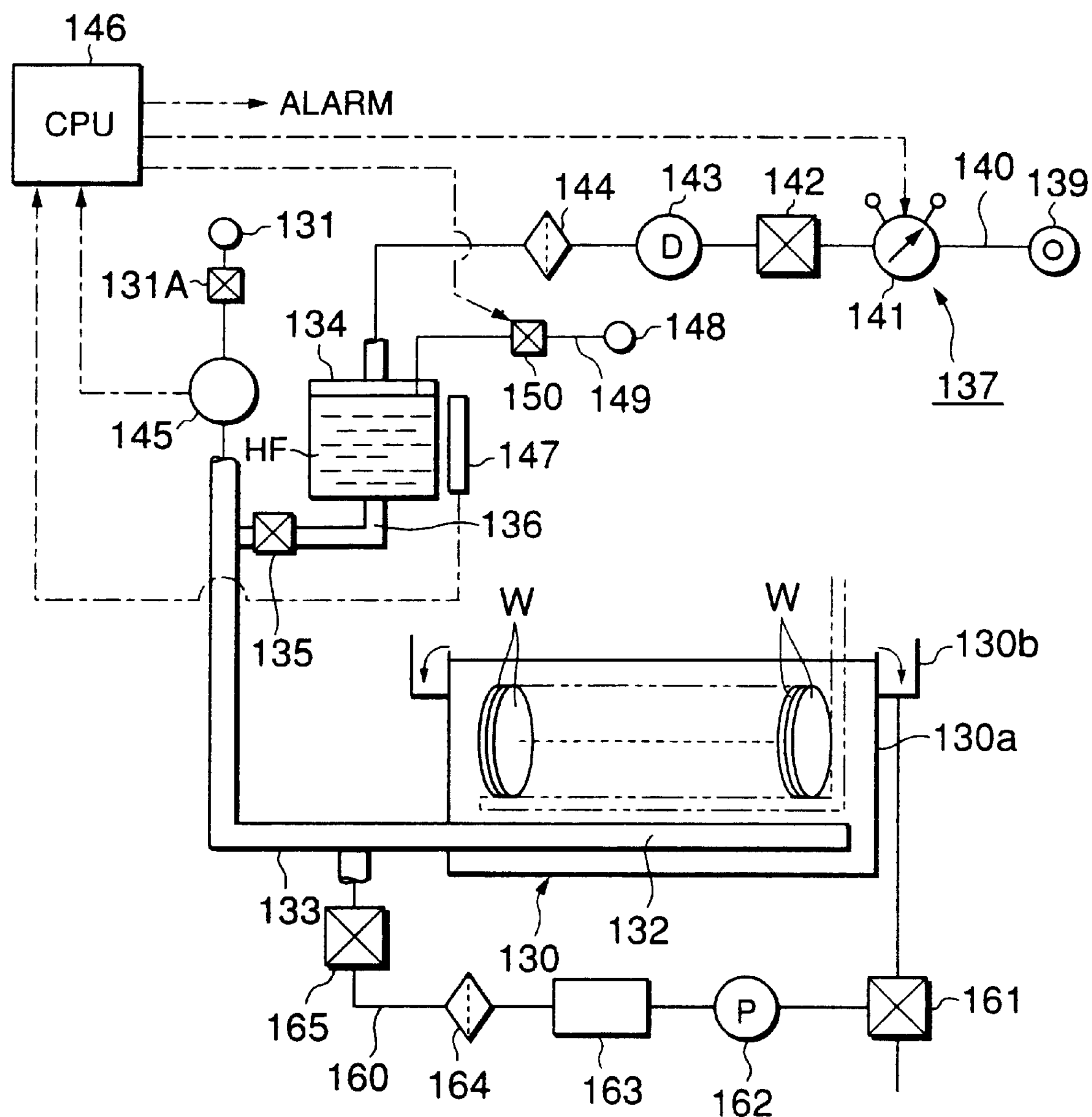
FIG. 13 is a schematic block diagram of the fifth preferred embodiment of a cleaning equipment according to the present invention.
Figure 14A:
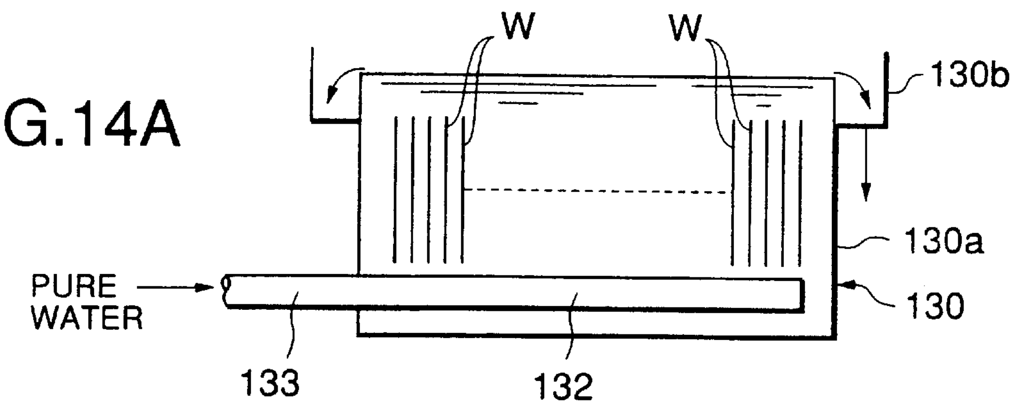
FIGS. 14(*a*), 14(*b*), 14(*c*) and 14(*d*) are schematic views showing the procedure for a cleaning method using the fifth preferred embodiment of a cleaning equipment according to the present invention.
Figure 14B:
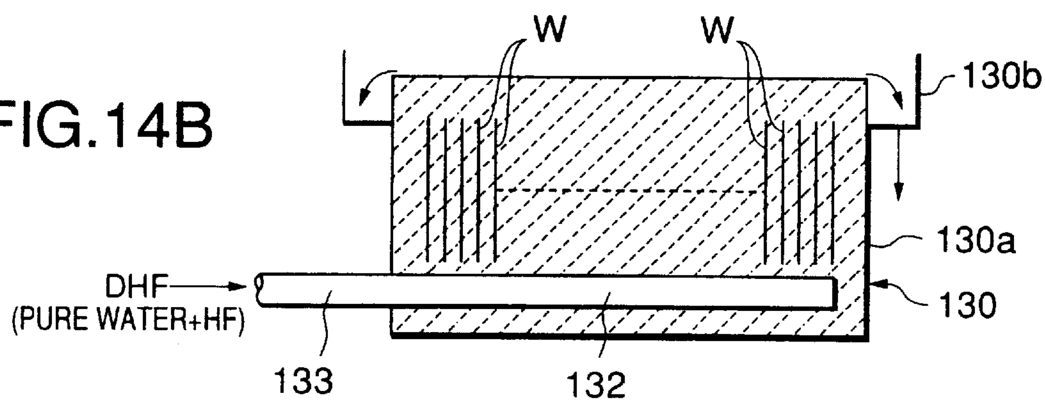
Figure 14C:
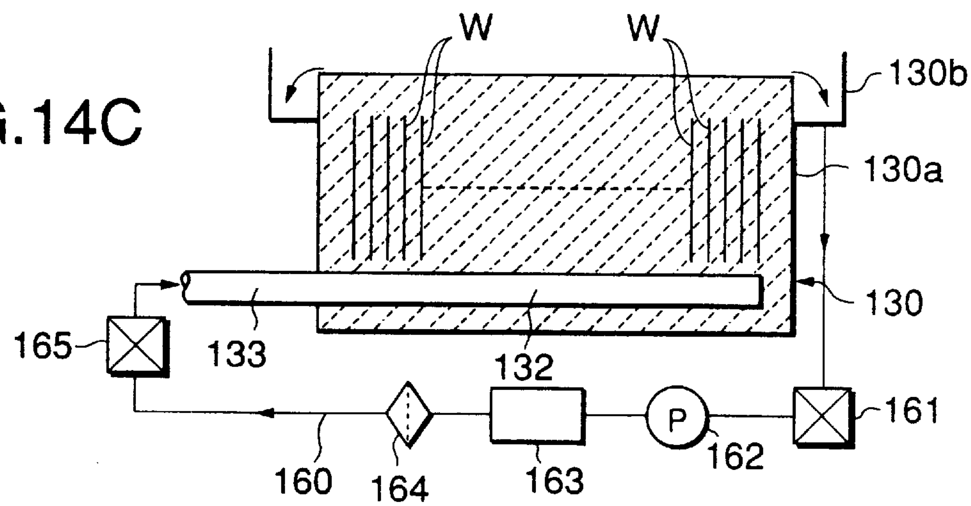
Figure 14D:
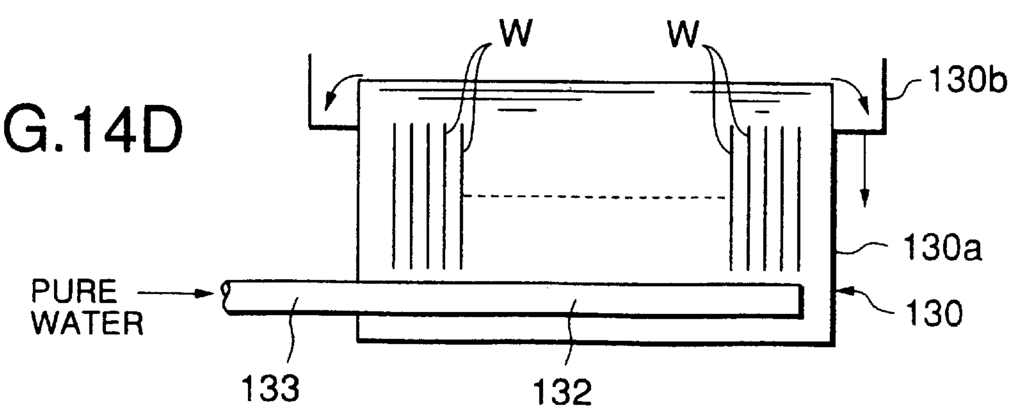

FIG. 13 is a schematic block diagram of the fifth preferred embodiment of a cleaning equipment according to the present invention.

The fifth preferred embodiment is intended to reduce consumption of a chemical and to effectively utilize the chemical. That is, a discharge port formed in the bottom of an outer bath 130*b* forming a cleaning bath 130 is connected to a cleaning solution supply nozzle (a cleaning solution supply part) 132, which is provided in the cleaning bath 130, by means of a circulating line 160. In the circulating line 160, a shut-off valve 161, a circulating pump 162, a temperature control mechanism 163, a filter 164 and a valve 165 are provided so as to be arranged in that sequence from the discharge port side toward the cleaning solution supply nozzle 132. A chemical, e.g., HF, which is stored in the cleaning bath 130, is circulated and supplied to remove metal contamination substances and oxide films which are adhered to the surfaces of the wafers W.

In the fifth preferred embodiment, other portions are the same as those in the third or fourth preferred embodiment, so that the same reference numbers are used for the same portions and the descriptions thereof are omitted.

Referring to FIGS. 14(*a*), 14(*b*), 14(*c*) and 14(*d*), an example of cleaning procedure using the fifth preferred embodiment of a cleaning equipment according to the present invention will be described below.

First, the injection shut-off valve 135 is closed to establish the communication between the pure water supply source 131 and the cleaning bath 130 to supply pure water from the cleaning solution supply nozzle 132 to the cleaning bath 130 to store the pure water in the cleaning bath 130 to allow the wafers W to be dipped in the pure water and to allow the pure water to overflow (first cleaning step: FIG. 14(*a*)).

Then, the injection shut-off valve 135 is open to allow the chemical supply pipe 136 to be open while allowing the pure water to flow from the pure water supply source 131. In this state, when the shut-off valve 142 provided in the $N_2$ gas supply pipe 140 is open and when the regulator 141 is actuated or when the predetermined shut-off valves 151*a* through 151*c* are open with the regulator 141, a predetermined pressure of $N_2$ gas is supplied to the chemical storing container 134. Thus, a predetermined amount of chemical, i.e., HF, flows from the chemical storing container 134 into the cleaning solution supply pipe 133 via the chemical supply pipe 136 to be diluted with the pure water, so that a predetermined concentration of DHF is supplied —to the cleaning bath 130 to allow the wafers W to be dipped into the DHF. In addition, the DHF overflows into the outer bath 130*b* to remove metal contamination substances or oxide films which are adhered to the surfaces of the wafers W (second cleaning step: FIG. 14(*b*)).

Then, after the shut-off valve 131A is closed to stop the supply of the pure water and after the injection shut-off valve 135 and the shut-off valves 142 and 151*a* through 151*c* are closed to stop the supply of the DHF, the shut-off valve 161 provided in the circulating line 160 is open, and the circulating pump 162 is driven to circulate and supply the DHF, which is stored in the cleaning bath 130, while controlling the temperature of the DHF to a predetermined temperature by means of the temperature control mechanism 163 and while allowing the DHF to pass through the filter 164, so as to continue to remove metal contamination substances or oxide films which are adhered to the surfaces of the wafers W dipped in the DHF (third cleaning step: FIG. 14(*c*)).

Then, the shut-off valve 131A is open to establish the communication between the pure water supply source 131 and the cleaning bath 130 again, and the injection shut-off valve 135 and the shut-off valves 142, 151*a* through 151*c* remain being closed to supply the pure water to the cleaning bath 130 to substitute the DHF for the pure water to allow the wafers W to be dipped in the pure water and to allow the pure water to overflow to remove the chemical, i.e., HF, which is adhered to the wafers W (fourth cleaning step: FIG. 14(*d*)).

As described above, after the pure water is allowed to overflow to clean the wafers W in the cleaning bath 130, a chemical, e.g., DHF, which is diluted to a predetermined concentration with the pure water continuously supplied to the cleaning bath 130, is allowed to overflow to clean the wafers W. Thereafter, the supply of the DHF is stopped to circulate and supply the DHF, which is stored in the cleaning bath 130, to clean the wafers W while controlling the temperature of the DHF and while carrying out the filtering. In addition, the pure water is allow to overflow in the cleaning bath 130 again to clean HF which is adhered to the wafers W. Thus, although the inplane uniformity of the wafers W deteriorates when the pure water is substituted for the DHF, the uniformity is recovered by substituting the pure water for the DHF again. Therefore, it is possible to obtain high etching uniformity and to improve cleaning efficiency. In addition, the chemical, e.g., DHF, which is stored in the cleaning bath 130, is circulated and supplied while controlling the temperature of the chemical and while carrying out the filtering, so that it is possible to reduce consumption of the DHF and it is possible to effectively utilize the DHF and to reduce the amount of adhered particles by the filtering.

In the above described preferred embodiments, while the cleaning equipment of the present invention has been applied to the third treatment unit 17, it may be applied to the first or second treatment unit 19 or 18 (see FIG. 1). In the above described preferred embodiments, while the cleaning equipment and method of the present invention have been applied to the cleaning system for semiconductor wafers, the invention may be applied to a cleaning system for glass substrates for LCDs.

As described above, according to the above described preferred embodiments, the following excellent advantages can be obtained by the above described construction.

(1) A predetermined concentration of chemical can be supplied to the cleaning bath only by the regulation of the gas pressure to remove particles, metal contamination substances or natural oxide films which are adhered to the surfaces of the objects to be treated. Therefore, it is possible to reduce the number of elements and the size of the equipment. In addition, it is possible to improve treatment efficiency, and it is possible to reduce the number of gas-liquid surface passages to reduce the amount of adhered particles and to improve etching uniformity.

(2) It is possible to detect the amount of supplied pure water using the pure water flow detecting means and it is possible to control the gas pressure control means on the basis of the detection signal outputted from the pure water flow detecting means. Therefore, it is possible to supply an accurately controlled concentration of chemical to the cleaning bath in addition to the advantages described in (1).

(3) The chemical stored in the cleaning bath can be circulated and supplied if necessary. Therefore, it is possible to reduce consumption of the chemical and to effectively utilize the chemical in addition to the advantages described in (1).

(4) It is possible to increase the gas pressure control range by selectively opening and closing the respective shut-off means. Therefore, it is possible to supply an accurately controlled concentration of chemical in addition to the advantages described in (1).

(5) The amount of the chemical stored in the chemical storing container can be maintained to be constant. Therefore, the amount of the chemical injected into the pure water can be maintained to be constant without being influenced by the amount of the stored chemical, and the concentration of the chemical can be maintained to be constant, in addition to the advantages described in (1).

(6) In addition to the advantages described in (1) and (5), the influence of the fluctuation of the amount of the chemical stored in the chemical storing container can be restricted so that the amount of the chemical injected into the pure water can be maintained to be constant.

(7) After the chemical cleaning, while the supply of the diluted chemical is stopped, the temperature of the diluted chemical in the cleaning bath is controlled to be a predetermined temperature, and the diluted chemical is circulated to clean the objects to be treated. Therefore, it is possible to reduce consumption of the chemical, and it is possible to effectively utilize the chemical and to reduce the amount of adhered particles by the filtering effect.

(8) After the pure water cleaning and the chemical cleaning, while the supply of the diluted chemical is stopped, the temperature of the diluted chemical in the cleaning bath is controlled to be a predetermined temperature, and the diluted chemical is circulated to clean the objects to be treated. Therefore, it is possible to reduce consumption of the chemical, and it is possible to effectively utilize the chemical and to reduce the amount of adhered particles by the filtering effect.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A cleaning equipment, comprising:

a cleaning bath for storing therein a cleaning solution and for allowing an object to be treated, into said cleaning solution to clean the surface of said object;

a cleaning solution supply pipe for connecting said cleaning bath to a pure water supply source;

a chemical storing container for storing therein a chemical;

a chemical supply pipe for connecting said cleaning solution supply pipe to said chemical storing container;

shut-off means for selectively opening and closing said chemical supply pipe;

chemical supply means for supplying said chemical from said chemical storing container to pure water flowing through said cleaning solution supply pipe;

chemical concentration control means for controlling the concentration of said chemical in said cleaning solution; and temperature detecting means for detecting the temperature of said cleaning solution in said cleaning bath, and wherein said chemical concentration control means has a control part which stores a temperature information previously given and forms a compared signal between a detection signal outputted from said temperature detecting means and the temperature information previously given, and wherein said chemical concentration control means controls the concentration of said chemical in said cleaning solution flowing on the basis of the compared signal.

2. A cleaning equipment as set forth in claim 1, wherein said cleaning bath has an inner bath for storing therein said cleaning solution to allow said object to be dipped therein, and an outer bath for covering an outer end portion of an opening portion of said inner bath, and which further comprises:

a circulating line for connecting the bottom of said outer bath to a cleaning solution supply part provided in said inner bath; and a circulating pump, a temperature control mechanism and a filter, which are provided in said circulating line.

3. A cleaning equipment as set forth in claim 1, wherein said chemical supply means further comprises a diaphragm pump.

4. A cleaning equipment, comprising:

a cleaning bath for storing therein a cleaning solution and for allowing an object to be treated, into said cleaning solution to clean the surface of said object;

a cleaning solution supply pipe for connecting said cleaning bath to a pure water supply source;

a chemical storing container for storing therein a chemical;

a chemical supply pipe for connecting said cleaning solution supply pipe to said chemical storing container;

shut-off means for selectively opening and closing said chemical supply pipe;

chemical supply means for supplying said chemical from said chemical storing container to pure water flowing through said cleaning solution supply pipe;

chemical concentration control means for controlling the concentration of said chemical in said cleaning solution; and pure water flow detecting means, provided in said cleaning solution supply pipe, for detecting the flow rate of said pure water supplied to said cleaning bath, and wherein said chemical concentration control means has a control part which stores a flow rate information previously given and forms a compared signal between a detection signal outputted from said pure water flow detecting means and the flow rate information previously given, and wherein said chemical concentration control means controls the concentration of said chemical in said cleaning solution flowing on the basis of the compared signal.

5. A cleaning equipment as set forth in claim 4, wherein said cleaning bath has an inner bath for storing therein said cleaning solution to allow said object to be dipped therein, and an outer bath for covering an outer end portion of an opening portion of said inner bath, and which further comprises:

a circulating line for connecting the bottom of said outer bath to a cleaning solution supply part provided in said inner bath; and a circulating pump, a temperature control mechanism and a filter, which are provided in said circulating line.

6. A cleaning equipment as set forth in claim 4, wherein said chemical supply means further comprises a diaphragm pump.

7. A cleaning equipment comprising:

a cleaning bath for storing therein a cleaning solution and for allowing an object to be treated, into said cleaning solution to clean the surface of said object;

a cleaning solution supply pipe for connecting said cleaning bath to a pure water supply source;

a chemical storing container for storing therein a chemical;

a chemical supply pipe for connecting said cleaning solution supply pipe to said chemical storing container;

shut-off means for selectively opening and closing said chemical supply pipe;

chemical supply means for supplying said chemical from said chemical storing container to pure water flowing through said cleaning solution supply pipe; and chemical concentration control means for controlling the concentration of said chemical in said cleaning solution, wherein said chemical supply means has gas supply means for supplying a chemical carrier gas into said chemical storing container, said gas supply means has a gas supply pipe for connecting said chemical storing container to a gas supply source, and said chemical concentration control means has gas pressure control means, provided in said gas supply pipe, for controlling the pressure of said chemical carrier gas in said chemical storing container.

8. A cleaning equipment as set forth in claim 7, which further comprises pure water flow detecting means, provided in said cleaning solution supply pipe, for detecting the flow rate of said pure water supplied to said cleaning bath, and wherein said gas pressure control means controls the pressure of said chemical carrier gas in said chemical storing container, on the basis of a detection signal outputted from said pure water flow detecting means.

9. A cleaning equipment as set forth in claim 7, wherein said chemical carrier gas is an inert gas.

10. A cleaning equipment as set forth in claim 7, wherein said cleaning bath has an inner bath for storing therein said cleaning solution to allow said object to be dipped therein, and an outer bath for covering an outer end portion of an opening portion of said inner bath, and which further comprises:

a circulating line for connecting the bottom of said outer bath to a cleaning solution supply part provided in said inner bath; and a circulating pump, a temperature control mechanism and a filter, which are provided in said circulating line.

11. A cleaning equipment as set forth in claim 7, wherein said gas supply means has a gas supply pipe for connecting said chemical storing container to a gas supply source, and which further comprises a gas control branch line of a plurality of shut-off means and diaphragm mechanisms which are provided in said gas supply pipe, each of said shut-off means being selectively open and closed.

12. A cleaning equipment as set forth in claim 7, which further comprises liquid level detecting means provided on said chemical storing container, and wherein said chemical concentration control means controls to maintain the liquid level of said chemical in said chemical storing container to be always constant on the basis of a detection signal outputted from said liquid level detecting means.

13. A cleaning equipment as set forth in claim 7, wherein said chemical storing container comprises a tank which has a circular cross-section and a height of less than or equal to the diameter of the tank.

14. A cleaning equipment as set forth in claim 7, which further comprises temperature detecting means for detecting the temperature of said cleaning solution in said cleaning bath, and wherein said chemical concentration control means controls the concentration of said chemical in said cleaning solution flowing on the basis of a detection signal outputted from said temperature detecting means.

15. A cleaning equipment as set forth in claim 7, which further comprises pure water flow detecting means, provided in said cleaning solution supply pipe, for detecting the flow rate of said pure water supplied to said cleaning bath, and wherein said chemical concentration control means controls the concentration of said chemical in said cleaning solution on the basis of a detection signal outputted from said pure water flow detecting means.

16. A cleaning equipment as set forth in claim 7, wherein said cleaning bath has an inner bath for storing therein said cleaning solution to allow said object to be dipped therein, and an outer bath for covering an outer end portion of an opening portion of said inner bath, and which further comprises:

a circulating line for connecting the bottom of said outer bath to a cleaning solution supply part provided in said inner bath; and a circulating pump, a temperature control mechanism and a filter, which are provided in said circulating line.

* * * * *